United States Patent
Lee et al.

(10) Patent No.: US 11,469,174 B2
(45) Date of Patent: Oct. 11, 2022

(54) SEMICONDUCTOR DEVICE

(71) Applicant: SAMSUNG ELECTRONICS CO., LTD., Suwon-si (KR)

(72) Inventors: Joon-Nyung Lee, Seoul (KR); Jeong Hoon Ahn, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 2 days.

(21) Appl. No.: 17/231,915

(22) Filed: Apr. 15, 2021

(65) Prior Publication Data

US 2021/0233842 A1    Jul. 29, 2021

Related U.S. Application Data

(62) Division of application No. 16/550,189, filed on Aug. 24, 2019, now Pat. No. 11,257,754.

(30) Foreign Application Priority Data

Jan. 8, 2019    (KR) .................. 10-2019-0002377

(51) Int. Cl.
*H01L 23/522* (2006.01)
*H01L 23/528* (2006.01)

(52) U.S. Cl.
CPC ........ *H01L 23/5227* (2013.01); *H01L 23/528* (2013.01)

(58) Field of Classification Search
None
See application file for complete search history.

(56) References Cited

U.S. PATENT DOCUMENTS

| 7,772,674 B2 | 8/2010 | Asahi |
| 7,928,539 B2 | 4/2011 | Nakashiba |
| 7,932,578 B2 | 4/2011 | Uchida |
| 7,999,386 B2 | 8/2011 | Uchida et al. |
| 8,159,044 B1 | 4/2012 | Chen et al. |
| 8,339,230 B2 | 12/2012 | Hijioka et al. |
| 9,000,876 B2 | 4/2015 | Tsai et al. |
| 2008/0272495 A1 | 11/2008 | Nakashiba |
| 2011/0316118 A1 | 12/2011 | Uchida et al. |
| 2014/0131775 A1 | 5/2014 | Disney |
| 2014/0252542 A1 | 9/2014 | Lee et al. |
| 2015/0129969 A1 | 5/2015 | Chuang et al. |
| 2018/0122785 A1 | 5/2018 | Fiorentino et al. |
| 2018/0308824 A1 | 10/2018 | Hsiao et al. |

FOREIGN PATENT DOCUMENTS

| JP | 5507796 B2 | 5/2014 |
| JP | 5938084 B2 | 6/2016 |
| JP | 6109385 B2 | 4/2017 |

*Primary Examiner* — Alexander G Ghyka
(74) *Attorney, Agent, or Firm* — Volentine, Whitt & Francos, PLLC

(57) ABSTRACT

A semiconductor device includes a substrate having a first region, a second region, a first buffer region, and a second buffer region. A plurality of conductive lines is disposed on the first region of the substrate. An inductor is disposed on the second region of the substrate, and a dummy pattern is disposed on the first buffer region of the substrate. The first buffer region is provided between the first region and the second region. The second buffer region is provided between the first buffer region and the second region.

9 Claims, 17 Drawing Sheets

SEMICONDUCTOR DEVICE

CROSS-REFERENCE TO RELATED APPLICATION

This is a Divisional of U.S. application Ser. No. 16/550,189, filed Aug. 24, 2019, and a claim of priority under 35 U.S.C § 119 is made to Korean Patent Application No. 10-2019-0002377 filed on Jan. 8, 2019, in the Korean Intellectual Property Office, the entire contents of which are hereby incorporated by reference.

BACKGROUND

The present disclosure relates to a semiconductor device, and more particularly, to a semiconductor device including an inductor.

As semiconductor devices have been finely and highly integrated, pitches of metal interconnections of semiconductor devices have been narrowed. Thus, parasitic capacitance of semiconductor devices has been increased such that operating speeds of semiconductor devices are reduced. Various research has been conducted for low-resistance metal interconnections and/or low-dielectric constant dielectrics to reduce parasitic capacitance of semiconductor devices.

SUMMARY

Some example embodiments of the present disclosure provide a semiconductor device with enhanced reliability.

According to some example embodiments of the present disclosure, a semiconductor device may comprise: a substrate having a first region, a second region, a first buffer region, and a second buffer region; a plurality of conductive lines on the first region of the substrate; an inductor on the second region of the substrate; and a dummy pattern on the first buffer region of the substrate. The first buffer region may be provided between the first region and the second region. The second buffer region may be provided between the first buffer region and the second region.

According to some example embodiments of the present disclosure, a semiconductor device may comprise: a substrate having a first region, a second region, and a buffer region between the first region and the second region; a lower interlayer dielectric layer on the substrate; a conductive line on a top surface of the lower interlayer dielectric layer on the first region of the substrate; a dummy pattern on the top surface of the lower interlayer dielectric layer on the buffer region of the substrate; and an inductor on the second region of the substrate. The inductor may include a conductor on the top surface of the lower interlayer dielectric layer. A top surface of the conductive line may be provided at a different level from that of a top surface of the conductor.

According to some example embodiments of the present disclosure, a semiconductor device may comprise: a substrate having a first region, a second region, and a buffer region between the first region and the second region; a plurality of internal components on the first region of the substrate; a plurality of conductive lines on the first region of the substrate and electrically connected to the internal components; an inductor on the second region of the substrate; and a dummy pattern on the first buffer region of the substrate. When viewed in plan, a minimum distance between the dummy pattern and the conductive lines may be less than a minimum distance between the dummy pattern and the inductor.

According to some example embodiments of the present disclosure, a semiconductor device has a first region and a second region, which is mutually exclusive with the first region. The semiconductor device includes a substrate, a first dielectric layer disposed over the substrate in each of the first region and the second region, and a second dielectric layer disposed over the first dielectric layer in each of the first region and the second region. A first conductor is formed within the first dielectric layer and directly electrically connected to a first electronic device. A second conductor is formed within the second dielectric layer. A dummy conductor is formed in the first dielectric layer and is not electrically connected to an electronic device. The first conductor and dummy conductor are disposed in the first region, but not in the second region, and the second conductor is disposed in the second region but not the first region.

According to some example embodiments of the present disclosure, a method of manufacturing a semiconductor device having a first region and a second region, which is mutually exclusive with the first region, is disclosed. The method includes forming a substrate, forming a first dielectric layer disposed over the substrate in each of the first region and the second region, and forming a second dielectric layer disposed over the first dielectric layer in each of the first region and the second region. A first conductor is formed in the first dielectric layer and is directly electrically connected to a first electronic device. A second conductor is formed within the second dielectric layer. A dummy conductor is formed in the first dielectric layer and is not electrically connected to an electronic device. The first conductor and dummy conductor are formed to be disposed in the first region, but not in the second region, and the second conductor is formed to be disposed in the second region but not the first region.

DETAILED DESCRIPTION OF EMBODIMENTS

Figure 1A:
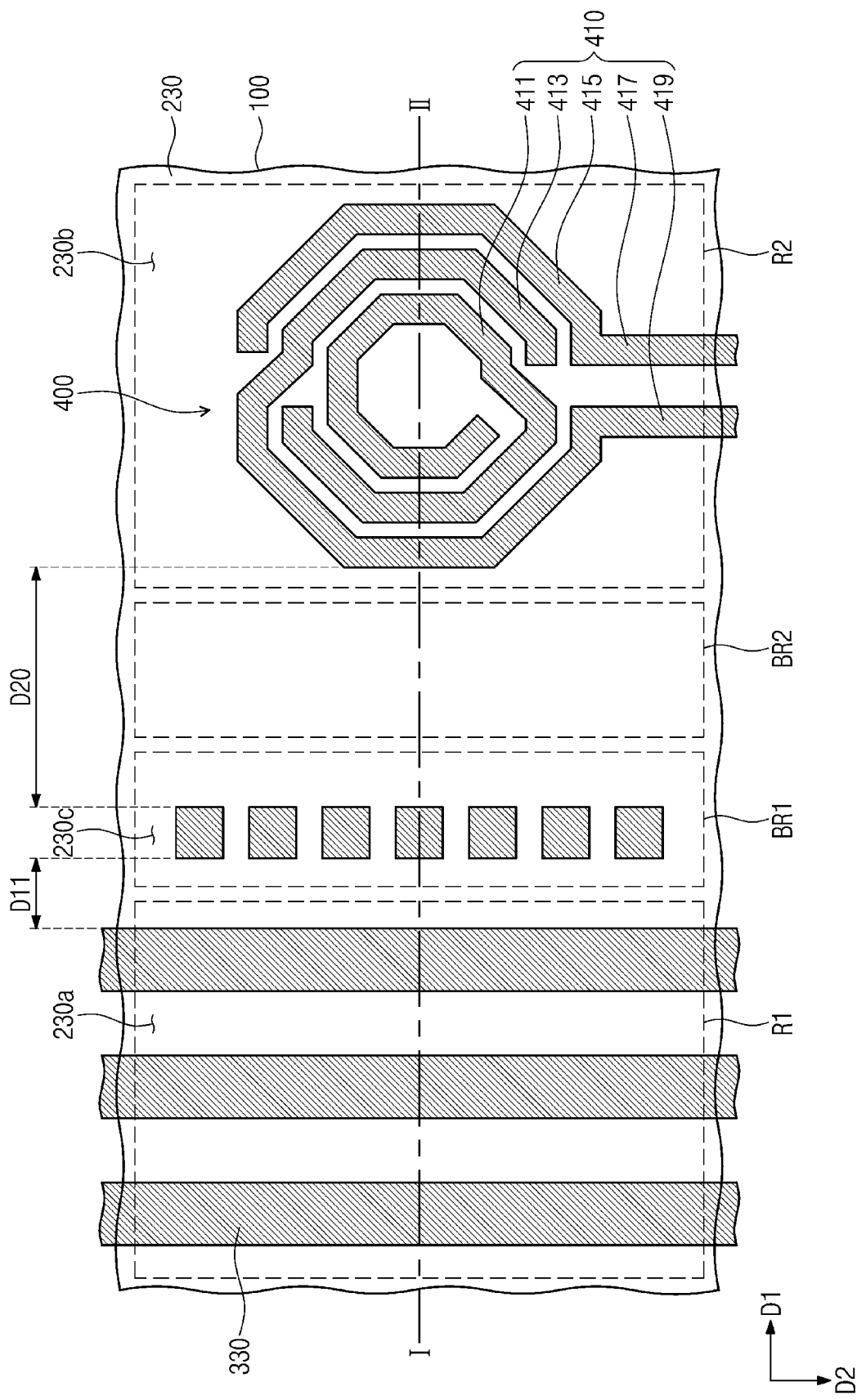
FIG. 1A illustrates a plan view showing a semiconductor device according to some example embodiments.

Like reference numerals may indicate like components throughout the description. The following will now describe a semiconductor device and a method of fabricating the same according to the present disclosure.

Figure 1B:
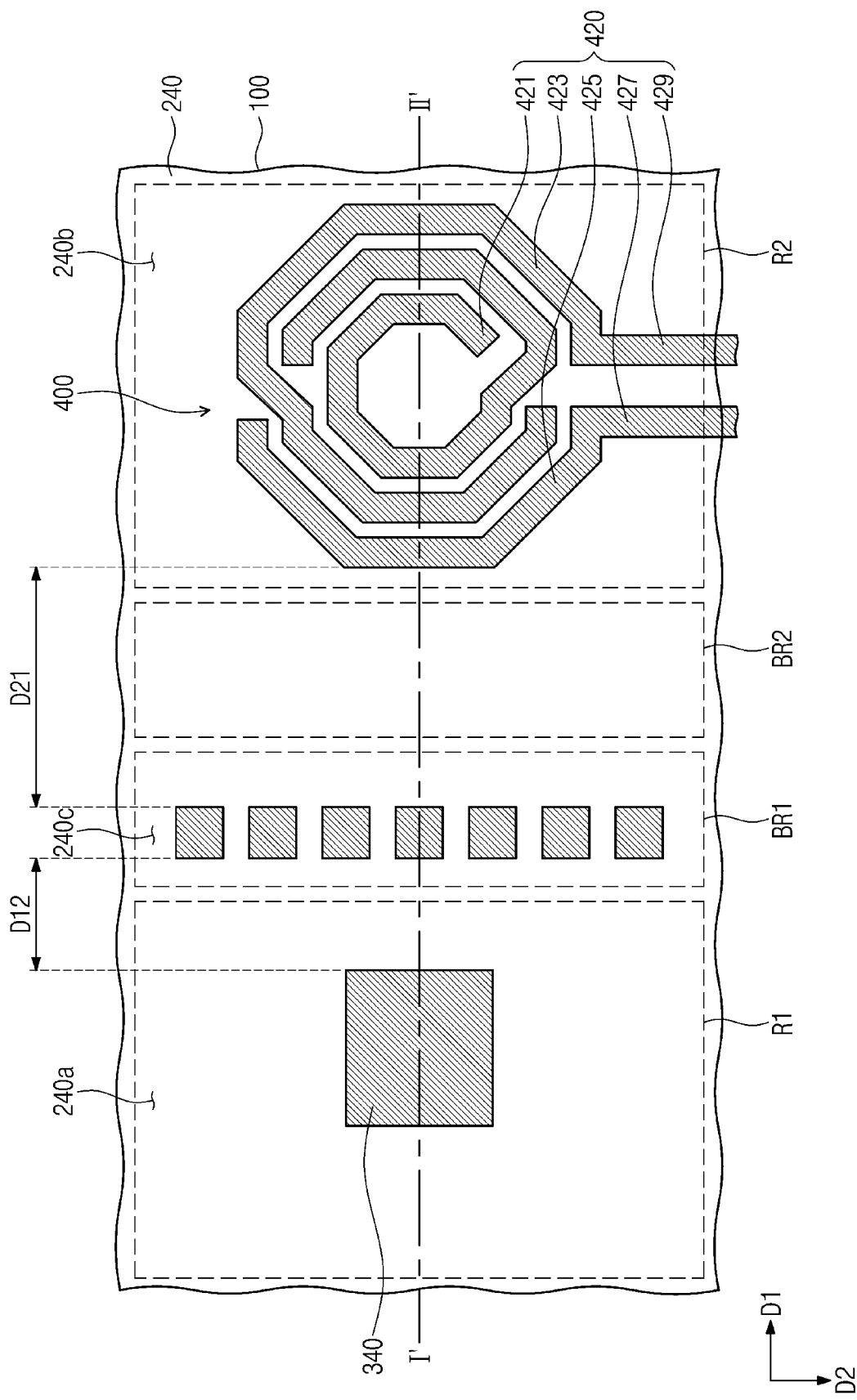
FIG. 1B illustrates a plan view showing a semiconductor device when viewed from a top surface of a fourth interlayer dielectric layer.
Figure 1C:
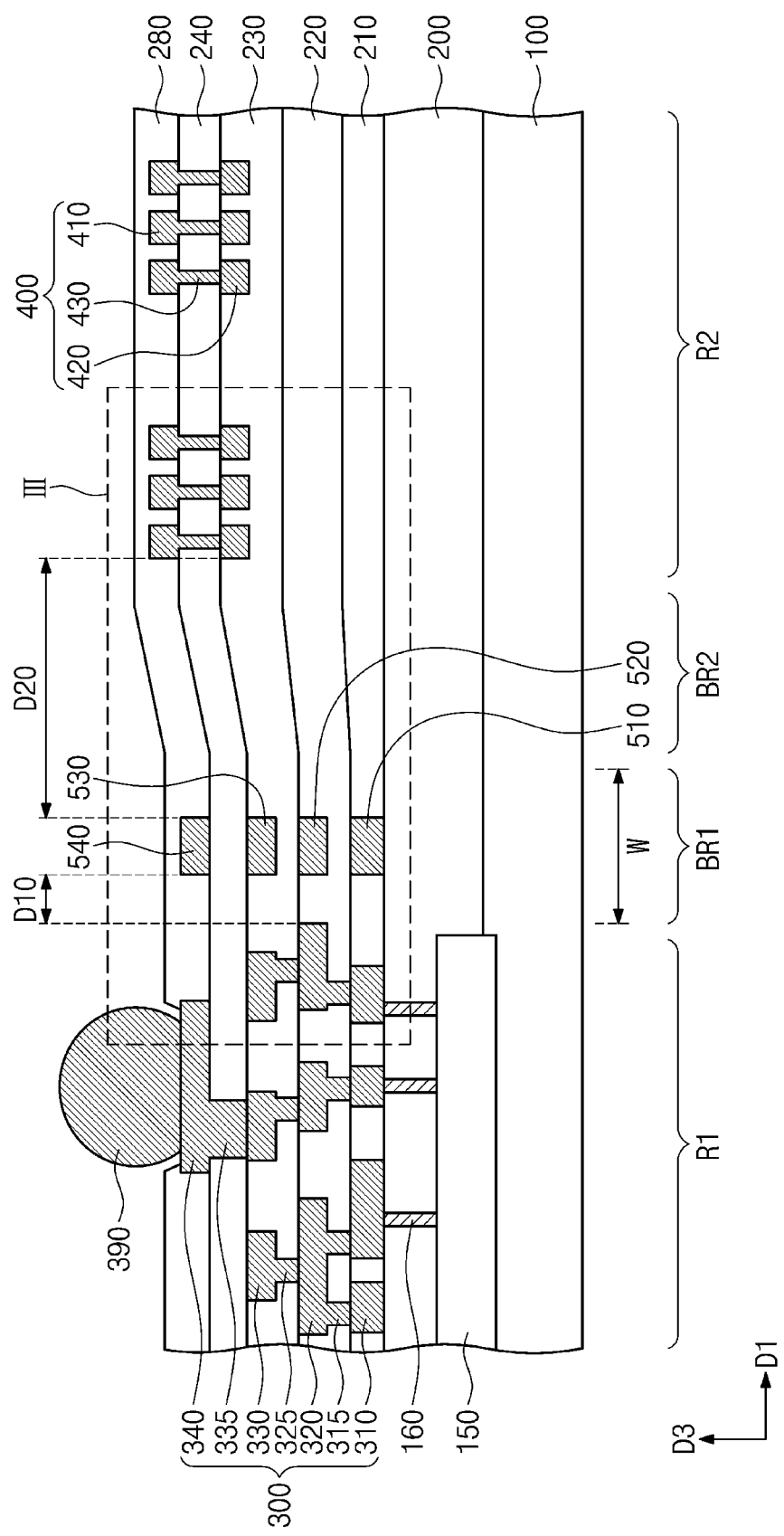
FIG. 1C illustrates a cross-sectional view taken along lines I-II of FIG. 1A and along line I'-II' of FIG. 1B.
Figure 1D:
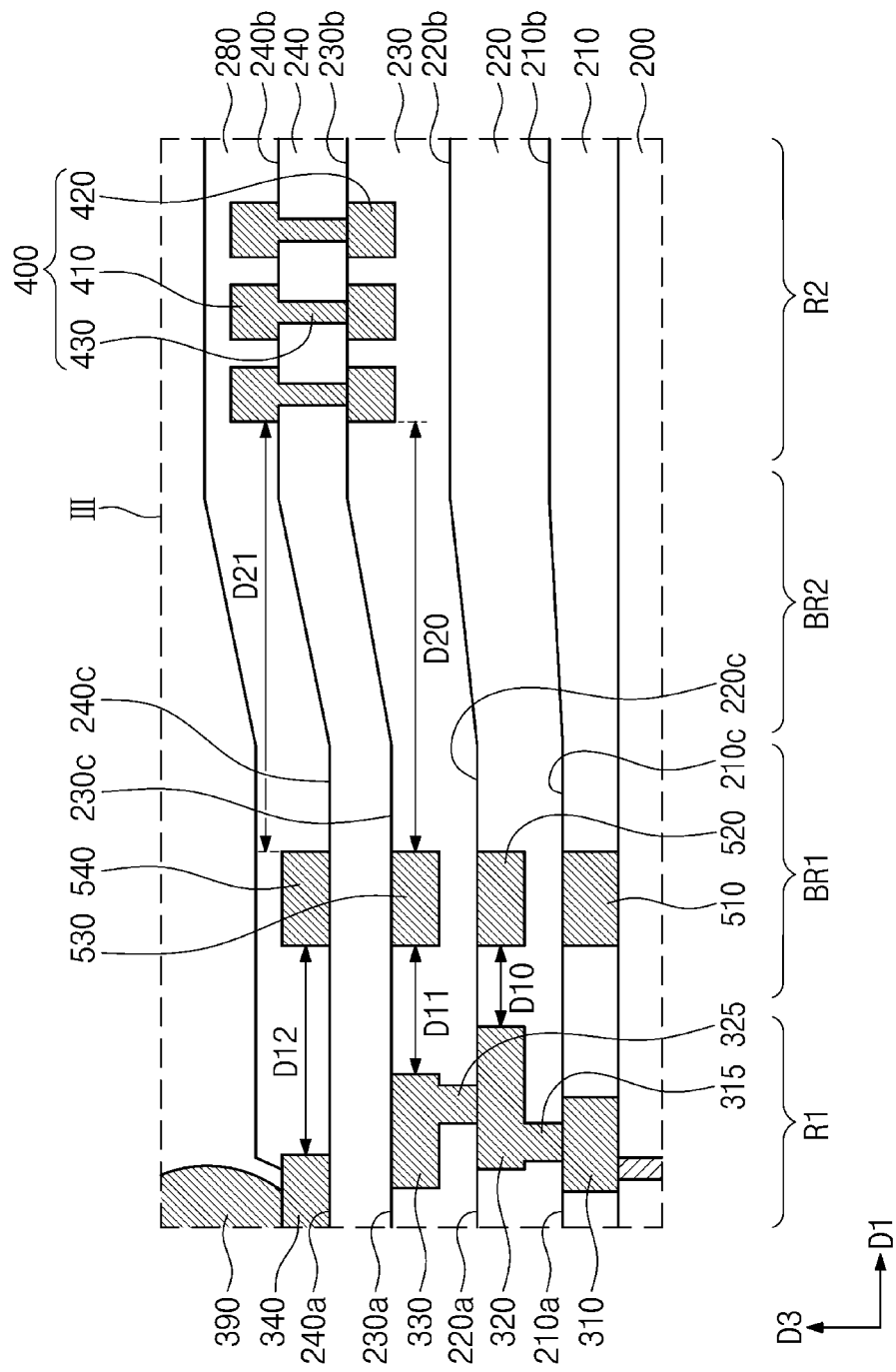
FIG. 1D illustrates an enlarged view showing section III of FIG. 1C.
Figure 1E:
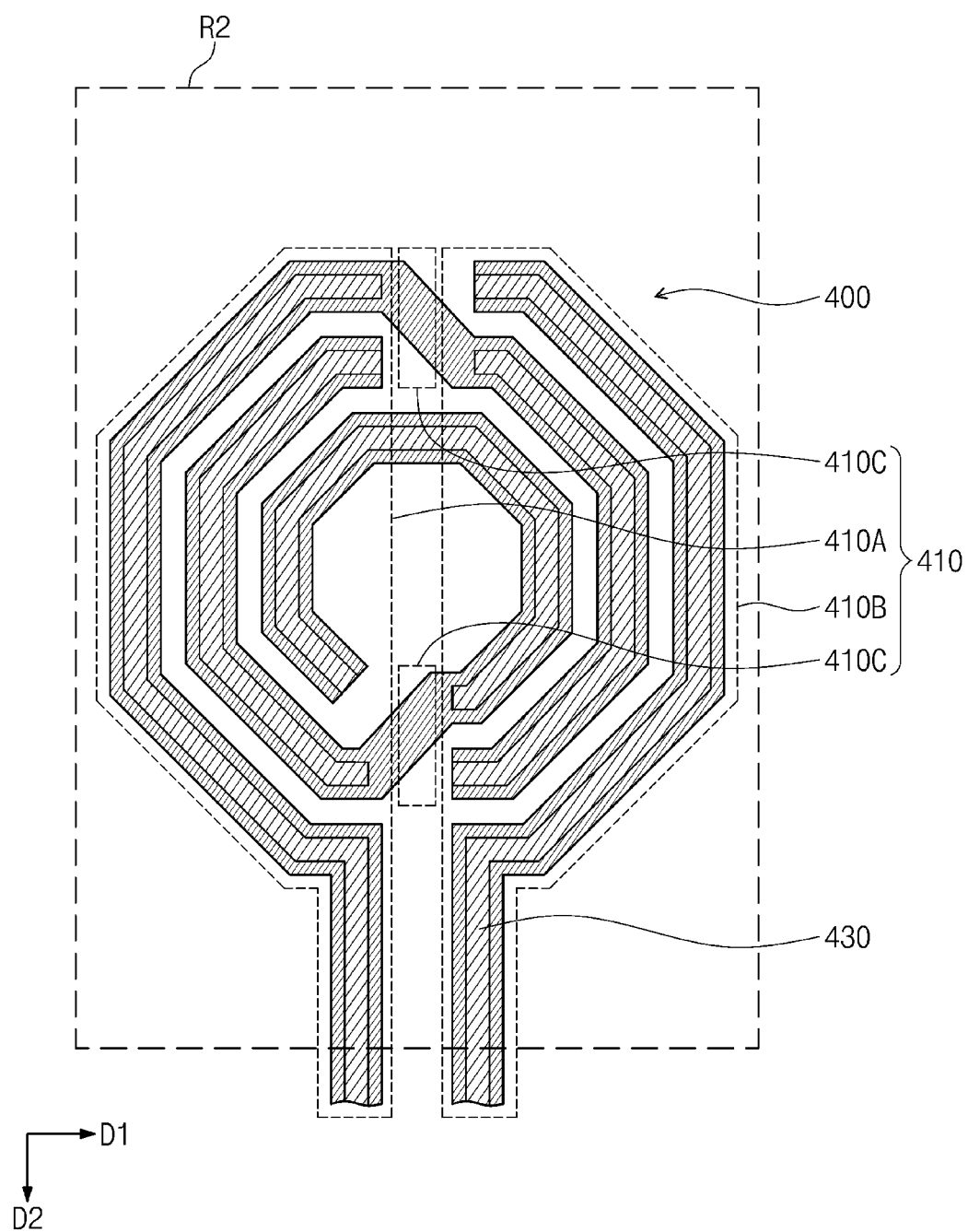
FIG. 1E illustrates a plan view showing a first conductive layer and a via of an inductor according to some example embodiments.
Figure 1F:
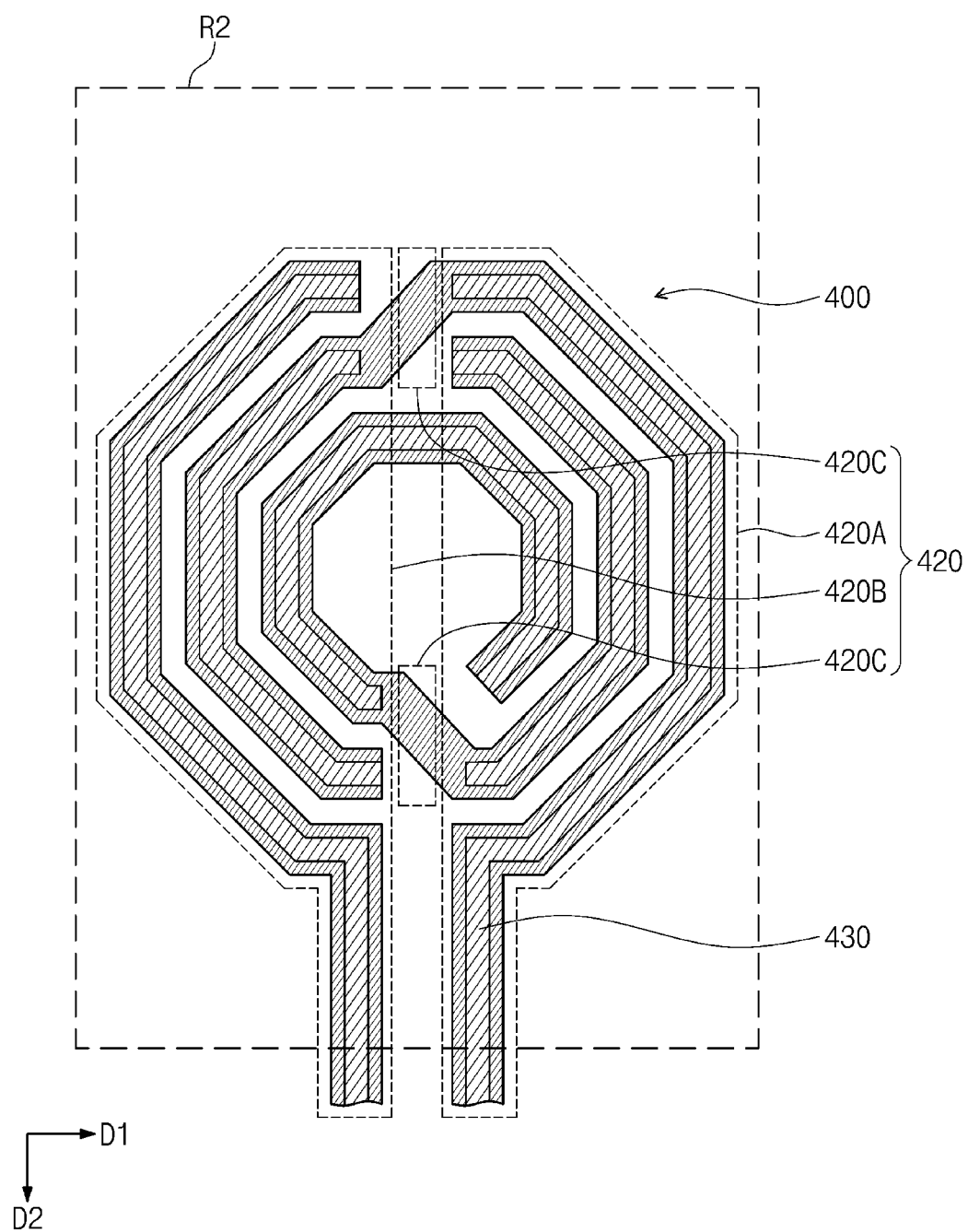
FIG. 1F illustrates a plan view showing a second conductive layer and a via of an inductor according to some example embodiments.

FIG. 1A illustrates a plan view showing a semiconductor device according to some example embodiments. FIG. 1B illustrates a plan view showing a semiconductor device when viewed from a top surface of a fourth interlayer dielectric layer. FIG. 1C illustrates a cross-sectional view taken along lines I-II of FIG. 1A and along line I'-II' of FIG. 1B. FIG. 1D illustrates an enlarged view showing section III of FIG. 1C. FIG. 1E illustrates an enlarged view of a second region depicted in FIG. 1A, showing a first conductive layer and a via of an inductor according to some example embodiments. FIG. 1F illustrates an enlarged view of a second region depicted in FIG. 1A, showing a second conductive layer and a via of an inductor according to some example embodiments.

Referring to FIGS. 1A to 1F, a semiconductor device may include a substrate 100, a lower structure 150, a lower dielectric layer 200, interlayer dielectric layers 210, 220, 230, and 240, a conductive structure 300, an inductor 400, and dummy patterns 510, 520, 530, and 540.

The substrate 100 may have a first region R1, a second region R2, and buffer regions BR1 and BR2. The buffer regions BR1 and BR2 may be provided between the first region R1 and the second region R2. The buffer regions BR1 and BR2 may include a first buffer region BR1 and a second buffer region BR2. The first buffer region BR1 may be closer to the first region R1 than to the second region R2. The second buffer region BR2 may be provided between the first buffer region BR1 and the second region R2. The substrate 100 may be a semiconductor substrate. The substrate 100 may include, for example, one or more of silicon (Si), germanium (Ge), and silicon-germanium (SiGe). A first direction D1 may be parallel to a top surface of the substrate 100. A second direction D2 may be parallel to the top surface of the substrate 100 and substantially perpendicular to the first direction D1. A third direction D3 may be substantially perpendicular to the top surface of the substrate 100.

The lower structure 150 may be provided on the first region R1 of the substrate 100. The lower structure 150 may include internal components, such as transistors.

The lower dielectric layer 200 may be provided on the substrate 100 and may cover the lower structure 150. The lower dielectric layer 200 may cover the first region R1, the second region R2, and the buffer regions BR1 and BR2 of the substrate 100. The lower dielectric layer 200 may include a silicon-based dielectric material. The silicon-based dielectric material may include one or more of silicon oxide, silicon nitride, and silicon oxynitride. The lower dielectric layer 200 may be a single layer or a multiple layer.

Contact plugs 160 may penetrate the lower dielectric layer 200 and have connection with the lower structure 150. For example, the contact plugs 160 may be coupled to the internal components of the lower structure 150. In this description, the phrase "electrically connected/coupled" may include "directly connected/coupled" or "indirectly connected/coupled through another conductive component." In this description, the phrase "connected/coupled to the lower structure 150" may include "connected/coupled to the internal components of the lower structure 150."

The interlayer dielectric layers 210, 220, 230, and 240 may be stacked on the lower dielectric layer 200. The interlayer dielectric layers 210, 220, 230, and 240 may include a lower interlayer dielectric layer 210 and 220 and an upper interlayer dielectric layer 230 and 240. The lower interlayer dielectric layer 210 and 220 may include a first interlayer dielectric layer 210 and a second interlayer dielectric layer 220. The upper interlayer dielectric layer 230 and 240 may include a third interlayer dielectric layer 230 and a fourth interlayer dielectric layer 240. Each of the interlayer dielectric layers 210, 220, 230, and 240 may cover the first region R1, the second region R2, and the buffer regions BR1 and BR2 of the substrate 100. The interlayer dielectric layers 210, 220, 230, and 240 may include one or more of silicon oxide, silicon nitride, and silicon oxynitride. The number of the interlayer dielectric layers 210, 220, 230, and 240 may be variously changed. At least one fifth interlayer dielectric layer may further be provided between two adjacent ones of the first to fourth interlayer dielectric layers 210, 220, 230, and 240.

The interlayer dielectric layers 210, 220, 230, and 240 may have their first top surfaces 210a, 220a, 230a, and 240a, second top surfaces 210b, 220b, 230b, and 240b, and third top surfaces 210c, 220c, 230c, and 240c. When viewed in plan as shown in FIG. 1D, the first top surfaces 210a, 220a, 230a, and 240a of the interlayer dielectric layers 210, 220, 230, and 240 may overlap the first region R1 of the substrate 100. When viewed in plan, the second top surfaces 210b, 220b, 230b, and 240b of the interlayer dielectric layers 210, 220, 230, and 240 may overlap the second region R2 of the substrate 100. The first top surfaces 210a, 220a, 230a, and 240a and the second top surfaces 210b, 220b, 230b, and 240b of the interlayer dielectric layers 210, 220, 230, and 240 may be substantially flat. The third top surfaces 210c, 220c, 230c, and 240c of the interlayer dielectric layers 210, 220, 230, and 240 may overlap the first buffer region BR1 of the substrate 100. The third top surfaces 210c, 220c, 230c, and 240c of the interlayer dielectric layers 210, 220, 230, and 240 may be correspondingly connected to the first top surfaces 210a, 220a, 230a, and 240a and to the second top surfaces 210b, 220b, 230b, and 240b of the interlayer dielectric layers 210, 220, 230, and 240. For example, the first and second top surfaces 210a and 210b of the first interlayer dielectric layer 210 may be provided respectively on the first and second regions R1 and R2 of the substrate 100. The third top surface 210c of the first interlayer dielectric layer 210 may be provided on the first buffer region BR1 and connected to the first and second top surfaces 210a and 210b of the first interlayer dielectric layer 210. The interlayer dielectric layers 210, 220, 230, and 240 may have their inclined top surfaces on the second buffer region BR2.

The conductive structure 300 may be provided on and in the interlayer dielectric layers 210, 220, 230, and 240. The conductive structure 300 may be provided on the first region R1 of the substrate 100, but not on the second region R2 and the buffer regions BR1 and BR2 of the substrate 100. The conductive structure 300 may be electrically connected through contact plugs 160 to the lower structure 150. The conductive structure 300 may include, for example, copper, aluminum, or tungsten.

The conductive structure 300 may include conductive vias 315, 325, and 335 and conductive lines 310, 320, 330, and 340. Each of the conductive lines 310, 320, 330, and 340 may be provided on a top surface of one of the interlayer dielectric layers 210, 220, 230, and 240. The conductive lines 310, 320, 330, and 340 may include first conductive lines 310, second conductive lines 320, third conductive lines 330, and fourth conductive lines 340. The first conductive lines 310 and second conductive lines 320 may constitute a lower conductive line. The first conductive lines 310, the second conductive lines 320, the third conductive lines 330, and the fourth conductive lines 340 may be disposed respectively on a top surface of the lower dielectric layer 200, the first top surface 210a of the first interlayer dielectric layer 210, the first top surface 220a of the second interlayer dielectric layer 220, and the first top surface 240a of the fourth interlayer dielectric layer 240. The conductive vias 315, 325, and 335 may penetrate corresponding interlayer dielectric layers 220, 230, and 240. The conductive vias 315, 325, and 335 may be disposed between and coupled to the conductive lines 310, 320, 330, and 340. The conductive vias 315, 325, and 335 may include a first conductive via 315, a second conductive via 325, and a third conductive via 335. The first conductive via 315 may be provided in the first interlayer dielectric layer 210. The first conductive via 315 may be provided between and electrically connected to the first conductive lines 310 and the second conductive lines 320. The first conductive via 315 and the second conductive lines 320 may be connected without interfaces therebetween. The second conductive via 325 may be provided in the second interlayer dielectric layer 220. The second conductive via 325 may be provided between the second conductive lines 320 and the third conductive lines 330 and may be electrically connected to the second conductive lines 320 and the third conductive lines 330. The second conductive via 325 and the third conductive lines 330 may be formed by the same process and thus connected without interfaces therebetween. The third conductive via 335 may be provided in the fourth interlayer dielectric layer 240 and electrically connected to the third and fourth conductive lines 330 and 340. The first conductive via 335 and the fourth conductive line 340 may be connected without an interface therebetween.

An uppermost one, such as the first conductive line 340, of the conductive lines 310, 320, 330, and 340 may be a chip pad. The fourth interlayer dielectric layer 240 may correspond to an uppermost interlayer dielectric layer. The fourth conductive line 340 may include, for example, aluminum. An uppermost one, such as the third conductive via 335, of the conductive vias 315, 325, and 335 may include aluminum. The first to third conductive lines 310, 320, and 330 and the first and second conductive vias 315 and 325 may include a different material from those of the fourth conductive line 340 and the third conductive vias 335. For example, the first to third conductive lines 310, 320, and 330 and the first and second conductive vias 315 and 325 may include copper or tungsten.

A connection terminal 390, as shown in FIG. 1C, may be provided on the first region R1 of the substrate 100. The connection terminal 390 may be provided on and electrically connected to the fourth conductive line 340. The connection terminal 390 may include a solder ball, a bump, a pillar, or a combination thereof. The connection terminal 390 may include at least one conductive material, such as tin, lead, silver, and an alloy thereof. A passivation layer 280 may further be provided on a top surface of the fourth interlayer dielectric layer 240 and may cover the fourth interlayer dielectric layer 240. The passivation layer 280 may expose the connection terminal 390. The passivation layer 280 may include a silicon-based dielectric material or a dielectric polymer.

The inductor 400 may be provided on the second region R2 of the substrate 100. The inductor 400 may include a first conductor 410, a second conductor 420, and a via 430. The numbers of the conductors 410 and 420 and the via 430 may be variously changed.

The first conductor 410 may be disposed on the second top surface 240b of the fourth interlayer dielectric layer 240. As shown in FIG. 1D, the first conductor 410 may have a top surface at a different level from (e.g., at a higher level than) that of a top surface of the fourth conductive line 340.

As shown in FIG. 1A, the first conductor 410 may include a first upper circular line 411, a second upper circular line 413, a third upper circular line 415, a first upper terminal 417, and a second upper terminal 419. The first upper circular line 411 may have a spiral shape. When viewed in plan, the second upper circular line 413 may be disposed outside the first upper circular line 411. The second upper circular line 413 may be spaced apart from the first upper circular line 411 and when viewed in plan may surround the first upper circular line 411. The third upper circular line 415 may have a semi-circular shape. The third upper circular line 415 may be disposed outside and spaced apart from the second upper circular line 413. The first upper terminal 417 may be connected to the third upper circular line 415. The second upper terminal 419 may be connected to the second upper circular line 413. The second upper terminal 419 may be spaced apart from the first upper terminal 417. One of the first and second upper terminals 417 and 419 may serve as an input terminal, and the other of the first and second upper terminals 417 and 419 may serve as an output terminal. The first conductor 410 may have outer and inner surfaces each of which includes a portion having an open octagonal shape when viewed in plan. Differently from that shown, the first conductor 410 may have outer and inner surfaces each of which includes a portion having an open rectangular or circular shape when viewed in plan. The first conductor 410 may include metal, such as aluminum.

The second conductor 420 may be disposed on the second top surface 230b of the third interlayer dielectric layer 230. As shown in FIG. 1D, the second conductor 420 may have a top surface at a different level from (e.g., at a higher level than) that of top surfaces of the third conductive lines 330. As shown in FIG. 1B, the second conductor 420 may include a first lower circular line 421, a second lower circular line 423, a third lower circular line 425, a first lower terminal 427, and a second lower terminal 429. The first lower circular line 421 may have a spiral shape. The second lower circular line 423 may be disposed outside and spaced apart from the first lower circular line 421. The second lower circular line 423 may have a spiral shape. The third lower circular line 425 may have a semi-circular shape. The third lower circular line 425 may be disposed outside and spaced apart from the second lower circular line 423. The first lower terminal 427 may be connected to the third lower circular line 425. The second lower terminal 429 may be connected to the second lower circular line 423. The second lower terminal 429 may be spaced apart from the first lower terminal 427. One of the first and second lower terminals 427 and 429 may serve as an input terminal, and the other of the first and second lower terminals 427 and 429 may serve as an output terminal. The second conductor 420 may have outer and inner surfaces each of which includes a portion having an open octagonal shape when viewed in plan. Differently from that shown, the second conductor 420 may have outer and inner surfaces each of which includes a portion having an open rectangular or circular shape when viewed in plan. The second conductor 420 may include a different material from that of the first conductor 410. For example, the second conductor 420 may include copper or tungsten.

When viewed in plan, the first conductor 410 and the second conductor 420 may be symmetrical with each other about a virtual line. The virtual line may be parallel to the second direction D2 and may correspond to a central line between two facing outermost lateral surfaces of the first conductor 410. The two outermost lateral surfaces may be parallel to the second direction D2. As shown in FIG. 1E, the first conductor 410 may include, for example, first upper symmetric part 410A, a second upper symmetric part 410B, and upper connect parts 410C. The upper connect parts 410C may be interposed between and connected to the first upper symmetric part 410A and the second upper symmetric part 410B. As shown in FIG. 1F, the second conductor 420 may include a first lower symmetric part 420A, a second lower symmetric part 420B, and lower connect parts 420C. The lower connect parts 420C may be interposed between and connected to the first lower symmetric part 420A and the second lower symmetric part 420B. The first upper symmetric part 410A of the first conductor 410 shown in FIG. 1E may be symmetrical with the first lower symmetric part 420A of the second conductor 420 shown in FIG. 1F. The second upper symmetric part 410B of the first conductor 410 may be symmetrical with the second lower symmetric part 420B of the second conductor 420.

As shown in FIG. 1C, the via 430 may be provided in the fourth interlayer dielectric layer 240 and may penetrate through the fourth interlayer dielectric layer 240. The via 430 may be interposed between the first conductor 410 and the second conductor 420. The via 430 may include a conductive material, such as aluminum. The via 430 and the first conductor 410 may be integrally formed and connected to each other without an interface therebetween. The via 430 may include the same material, such as aluminum, as that of the second conductor 420.

When viewed in plan as shown FIG. 1F, the via 430 may overlap the second conductor 420. For example, when viewed in plan, the via 430 may extend along the second conductor 420. The via 430 may overlap the first and second lower symmetric parts 420A and 420B and have a shape corresponding to those of the first and second lower symmetric parts 420A and 420B. The via 430 may have a width less than that of a portion of the second conductor 420, which portion vertically overlaps the via 430. The via 430 may not be provided on the lower connect parts 420C.

When viewed in plan as shown FIG. 1E, the via 430 may overlap the first conductor 410. For example, the via 430 may extend along the first conductor 410. The via 430 may overlap the first and second upper symmetric parts 410A and 410B and have a shape corresponding to those of the first and second upper symmetric parts 410A and 410B. The width of via 430 may be less than that of a portion of the first conductor 410, which portion vertically overlaps the via 430. The first upper symmetric part 410A may be electrically connected through the via 430 to the second lower symmetric part 420B. The second upper symmetric part 410B may be electrically connected through the via 430 to the first lower symmetric part 420A. The via 430 may not overlap the upper connect parts 410C.

The number of the conductors 410 and 420 may be variously changed. For example, although not shown, the inductor 400 may further include a third conductor provided on the second top surface 220b of the second interlayer dielectric layer 220 and a lower via interposed between the third conductor and the second conductor 420. In this case, the third conductor may have a planar shape equal to that of the first conductor 410. For another example, neither the second conductor 420 nor the via 430 may be provided.

The dummy patterns 510, 520, 530, and 540 may be disposed on the first buffer region BR1 of the substrate 100. The dummy patterns 510, 520, 530, and 540 may be insulated from the lower structure 150, the conductive lines 310, 320, 330, and 340, the connection terminal 390, and the inductor 400. The dummy patterns 510, 520, 530, and 540 may not be supplied with external electrical signals, voltage, and current. The dummy patterns 510, 520, 530, and 540 may be disposed on the interlayer dielectric layers 210, 220, 230, and 240. The dummy patterns 510, 520, 530, and 540 may include a first dummy pattern 510, a second dummy pattern 520, a third dummy pattern 530, and a fourth dummy pattern 540. The first dummy pattern 510 and the second dummy pattern 520 may constitute a lower dummy pattern. The first dummy pattern 510 may be disposed on the lower dielectric layer 200 and in the first interlayer dielectric layer 210. As shown in FIG. 1D, the first dummy pattern 510 may have a top surface coplanar with the third top surface 210c of the first interlayer dielectric layer 210. The top surface of the first dummy pattern 510 may be provided at a level the same as or similar to that of top surfaces of the first conductive lines 310.

The second dummy pattern 520 may be disposed on the third top surface 210c of the first interlayer dielectric layer 210 and in an upper portion of the second interlayer dielectric layer 220. The second dummy pattern 520 may have a top surface coplanar with the third top surfaces 220c of the second interlayer dielectric layer 220. The top surface of the second dummy pattern 520 may be provided at a level the same as or similar to that of top surfaces of the second conductive lines 320.

The third dummy pattern 530 may be disposed on the third top surface 220c of the second interlayer dielectric layer 220 and in the third interlayer dielectric layer 230. The third dummy pattern 530 may have a top surface coplanar with the third top surfaces 230c of the third interlayer dielectric layer 230. The top surface of the third dummy pattern 530 may be provided at a level lower than that of the top surface of the second conductor 420 and the same as or similar to that of the top surfaces of the third conductive lines 330.

The fourth dummy pattern 540 may be disposed on the third top surface 240c of the fourth interlayer dielectric layer 240. The fourth dummy pattern 540 may include a different material from those of the first to third dummy patterns 510, 520, and 530. For example, the fourth dummy pattern 540 may include aluminum. The first to third dummy patterns 510, 520, and 530 may include a conductive material, such as copper or tungsten. The planar shape of each of the first to fourth dummy patterns 510, 520, 530, and 540 may be variously changed.

A minimum distance D10 between the conductive structure 300 and the dummy patterns 510, 520, 530, and 540 may be less than a minimum distance D20 or D21 between the inductor 400 and the dummy patterns 510, 520, 530, and 540. In this description, the minimum distances D10 and D20 may be a minimum horizontal distance measured in the first direction D1. For example, the minimum distance D10 may be a distance between an outermost second conductive line 320 and the second dummy pattern 520. The minimum distance D20 or D21 between the inductor 400 and the dummy patterns 510, 520, 530, and 540 may be a minimum distance D20 between the second conductor 420 and the third dummy pattern 530 or a minimum distance D21 between the first conductor 410 and the fourth dummy pattern 540, but the present disclosure is not limited thereto.

On each of the third and fourth interlayer dielectric layers 230 and 240, the dummy patterns 530 and 540 may be disposed closer to the conductive structure 300 than to the inductor 400. For example, a minimum distance D12 between the fourth dummy pattern 540 and the fourth conductive line 340 may be less than the minimum distance D21 between the fourth dummy pattern 540 and the first conductor 410. A minimum distance D1l between the third dummy pattern 530 and the third conductive line 330 may be less than the minimum distance D20 between the third dummy pattern 530 and the second conductor 420.

When a conductive component is disposed near the inductor 400, parasitic capacitance may be produced between the conductive component and the inductor 400. The conductive component may include metal lines, metal vias, or the dummy patterns 510, 520, 530, and 540. In certain embodiments, no conductive components (e.g., the dummy patterns 510, 520, 530, and 540) may be provided between a bottom surface of the second conductor 420 and a top surface of the lower dielectric layer 200. For example, the dummy patterns 510, 520, 530, and 540 may not be provided in the first and second interlayer dielectric layers 210 and 220 on the second region R2 of the substrate 100. As a result, the occurrence of parasitic capacitance may be prevented to increase reliability of semiconductor devices.

In certain embodiments, the dummy patterns 510, 520, 530, and 540 may not be provided on the second buffer region BR2. As discussed above, when viewed in plan, the minimum distance D10 between the conductive structure 300 and the dummy patterns 510, 520, 530, and 540 may be less than the minimum distance D20 or D21 between the inductor 400 and the dummy patterns 510, 520, 530, and 540. For example, the dummy patterns 510, 520, 530, and 540 may be spaced apart from the inductor 400 at certain intervals. Thus, the occurrence of parasitic capacitance may be effectively prevented between the inductor 400 and the dummy patterns 510, 520, 530, and 540.

The following will describe in detail the dummy patterns 510, 520, 530, and 540 and planarization of the interlayer dielectric layers 210, 220, 230, and 240.

FIGS. 2A to 2H illustrate cross-sectional views taken along lines I-II and I'-II' of FIG. 1A, showing a method of fabricating a semiconductor device according to some example embodiments. A duplicate description will be omitted below.

Figure 2A:
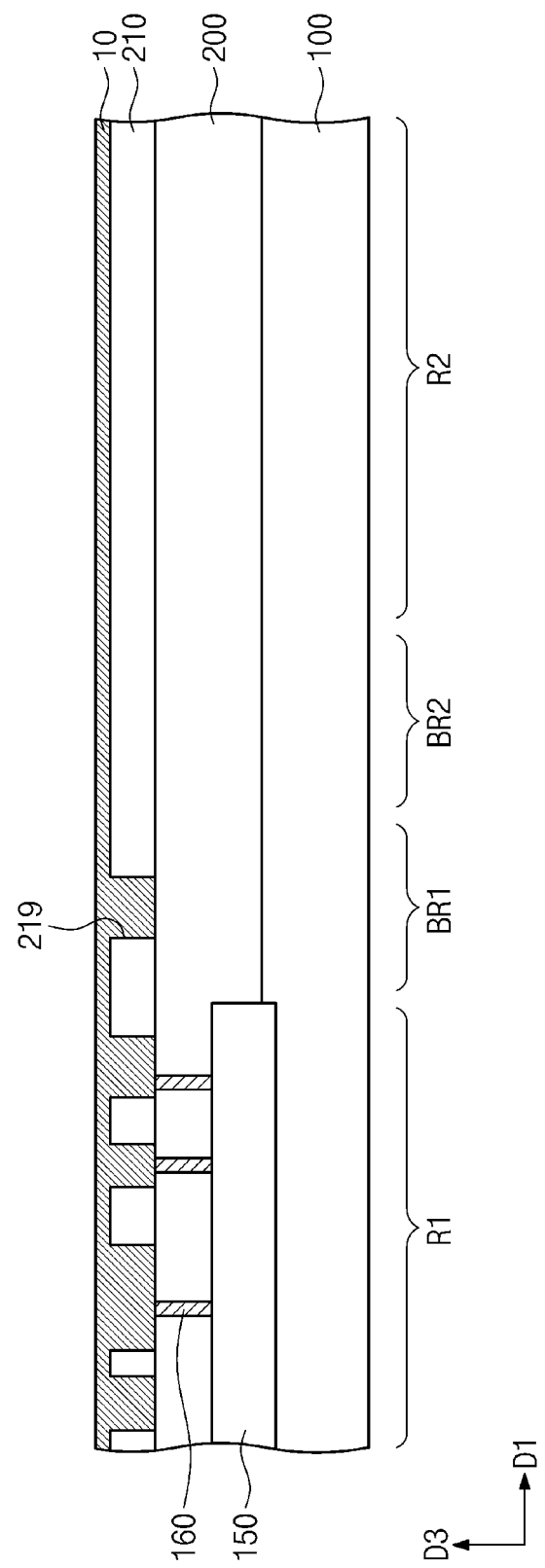
FIGS. 2A to 2H illustrate cross-sectional views showing a method of fabricating a semiconductor device according to some exemplary embodiments.

Referring to FIG. 2A, a lower structure 150, a lower dielectric layer 200, and a first interlayer dielectric layer 210 may be formed on a substrate 100 having a first region R1, a second region R2, a first buffer region BR1, and a second buffer region BR2. The first interlayer dielectric layer 210 may be formed to have a substantially flat top surface. First trenches 219 may be formed in the first interlayer dielectric layer 210. The first trenches 219 may be provided on the first region R1 and the first buffer region BR1 of the substrate 100. A first conductive layer 10 may be formed on the top surface of the first interlayer dielectric layer 210, filling the first trenches 219. The first conductive layer 10 may be formed on the first region R1, the second region R2, and the buffer regions BR1 and BR2 of the substrate 100.

Figure 2B:
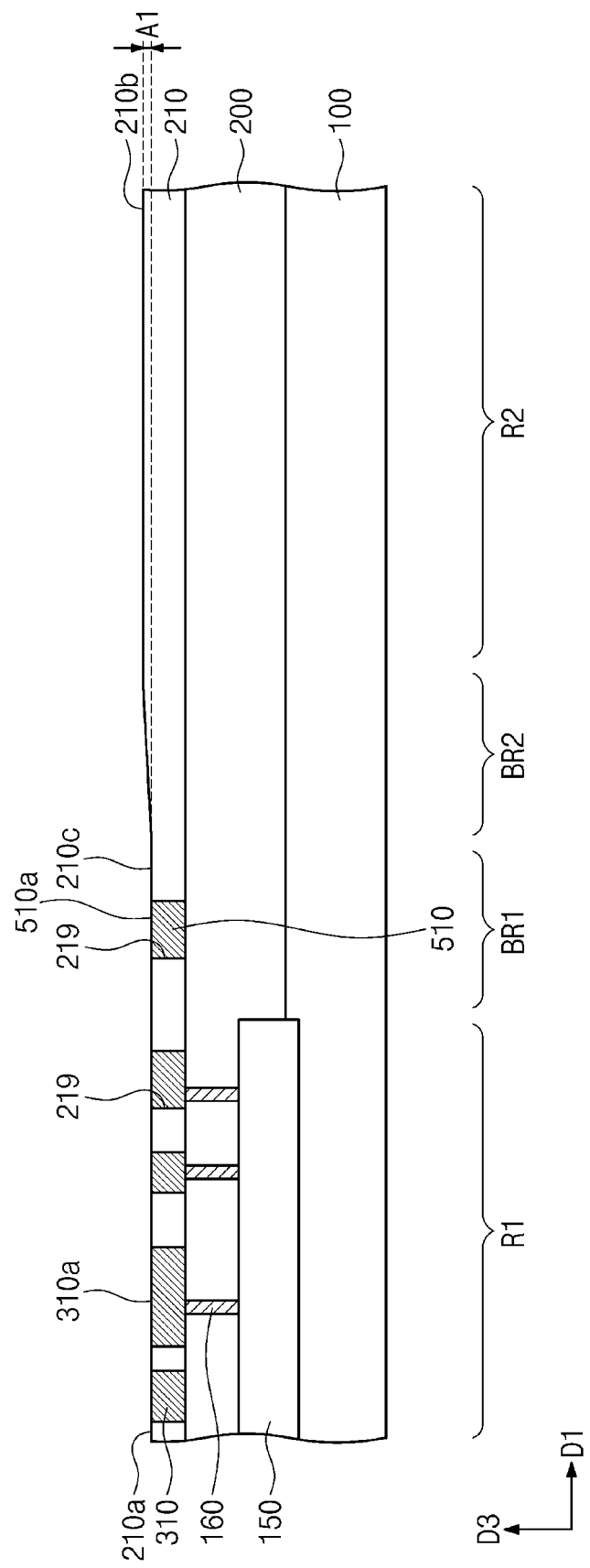

Referring to FIG. 2B, the first conductive layer 10 may be planarized to form first conductive lines 310 and a first dummy pattern 510. The planarization of the first conductive layer 10 may be achieved by a chemical mechanical polishing (CMP) process or an etch-back process. The planarization of the first conductive layer 10 may be terminated after the first interlayer dielectric layer 210 is exposed. Thus, the first conductive lines 310 may be separated from the first dummy pattern 510. The first conductive lines 310 and the first dummy pattern 510 may be provided in corresponding first trenches 219. In certain embodiments, when the first conductive layer 10 is planarized, the first conductive layer 10 may be removed at a different rate from that of the first interlayer dielectric layer 210. For example, the first conductive layer 10 may be removed faster than the first interlayer dielectric layer 210. After the planarization process is terminated, the first interlayer dielectric layer 210 may have a top surface whose level becomes lowered as approaching the first trenches 219. In certain embodiments, the first trenches 219 may be provided in the first interlayer dielectric layer 210 on the first region R1 of the substrate 100, but not in the first interlayer dielectric layer 210 on the second region R2 of the substrate 100. After the planarization process, the first interlayer dielectric layer 210 may have a second top surface 210b and a first top surface 210a at a lower level than that of the second top surface 210b. When the first dummy pattern 510 is not formed, the first top surface 210a may not be flat. For example, the first top surface 210a of the first interlayer dielectric layer 210 on an edge area of the first region R1 may be located at a different level from (e.g., at a higher level than) that of the top surface 210a of the interlayer dielectric layer 210 on a central area of the first region R1 of the substrate 100. The edge area of the first region R1 may be positioned closer to the second region R2 than the central area of the first region R1 is positioned. An outermost first conductive line 310 may have a top surface at a different level (e.g., at a higher level than) that of top surfaces of the first conductive lines 310 on the central region of the first region R1. In this case, a semiconductor device may decrease in reliability.

In certain embodiments, the first dummy pattern 510 may be provided on the first buffer region BR1 of the substrate 100. Therefore, when the first conductive layer 10 is planarized, although the first interlayer dielectric layer 210 on the second region R2 of the substrate 100 is removed at a different rate from that of the first interlayer dielectric layer 210 on the first region R1 of the substrate 100, the first interlayer dielectric layer 210 on the first buffer region BR1 may be removed at a rate the same as or similar to that of the first interlayer dielectric layer 210 on the first region R1. Thus, the second top surface 210b of the first interlayer dielectric layer 210 may be provided at a higher level than that of the first top surface 210a of the first interlayer dielectric layer 210. The first interlayer dielectric layer 210 may have a third top surface 210c at a level the same as or similar to that of the first top surface 210a of the first interlayer dielectric layer 210. The third top surface 210c of the first interlayer dielectric layer 210 may alleviate a level difference A1 between the first and second top surfaces 210a and 210b of the first interlayer dielectric layer 210. A level difference between the first and third top surfaces 210a and 210c of the first interlayer dielectric layer 210 may be less than the level difference A1 between the first and second top surfaces 210a and 210b of the first interlayer dielectric layer 210. In this description, the level difference may mean a difference in vertical level or a difference in level between two planes spaced apart in a third direction D3. The phrase "a level difference between two components is less than" may include "the level difference between two components is zero." In this sense, the first top surface 210a of the first interlayer dielectric layer 210 may be substantially flat. The top surfaces 310a of the first conductive lines 310 may be coplanar with the first top surface 210a of the first interlayer dielectric layer 210. The top surface 310a of the outermost first conductive line 310 may be provided at substantially the same level as that of the top surfaces 310a of the first conductive lines 310 on the central area of the first region R1. As a result, a semiconductor device may increase in reliability.

The first dummy pattern 510 may have a top surface 510a at a level the same as or similar to that of the top surfaces 310a of the first conductive lines 310. The top surface 510a of the first dummy pattern 510 may be coplanar with the third top surfaces 210c of the first interlayer dielectric layer 210.

In certain embodiments, a ratio of total area of the top surface 510a of the first dummy pattern 510 to area of the second top surface 210b of the first interlayer dielectric layer 210 may be equal to or similar to a ratio of total area of the top surfaces 310a of the first conductive lines 310 to area of the first top surface 210a of the first interlayer dielectric layer 210. For this reason, the level difference between the first and third top surfaces 210a and 210c of the first interlayer dielectric layer 210 may become further reduced.

Figure 2C:
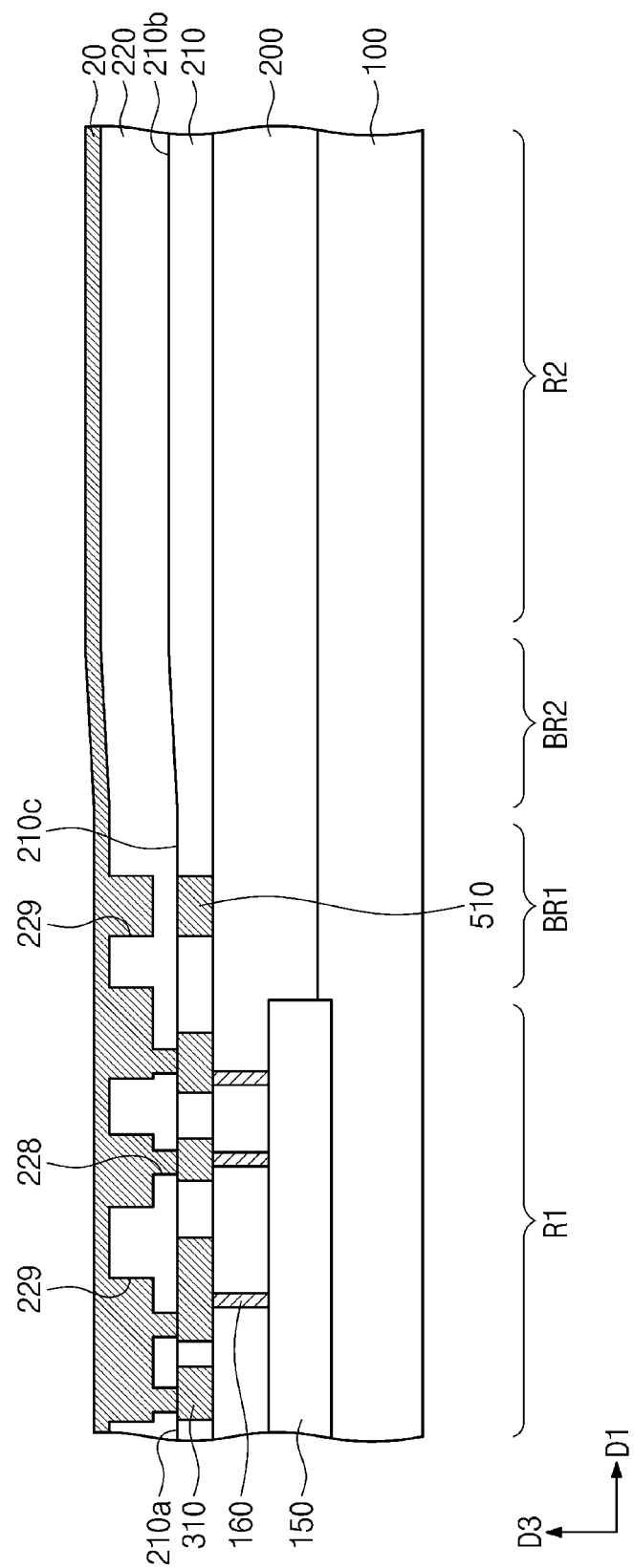

Referring to FIG. 2C, a second interlayer dielectric layer 220 may be formed on the first, second, and third top surfaces 210a, 210b, and 210c of the first interlayer dielectric layer 210, covering the first conductive lines 310 and the first dummy pattern 510. Second trenches 229 may be formed in an upper portion of the second interlayer dielectric layer 220. The second trenches 229 may be provided on the first region R1 and the first buffer region BR1 of the substrate 100. The second trenches 229 may not be provided on the second region BR2 and the second region R2 of the substrate 100. First holes 228 may be formed in a lower portion of the second interlayer dielectric layer 220 on the first region R1, exposing the first conductive lines 310. The first hole 228 may be spatially connected to the second trenches 229. A second conductive layer 20 may be formed on first, second, and third top surfaces 220a, 220b, 220c of the second interlayer dielectric layer 220, filling the first holes 228 and the second trenches 229.

Figure 2D:
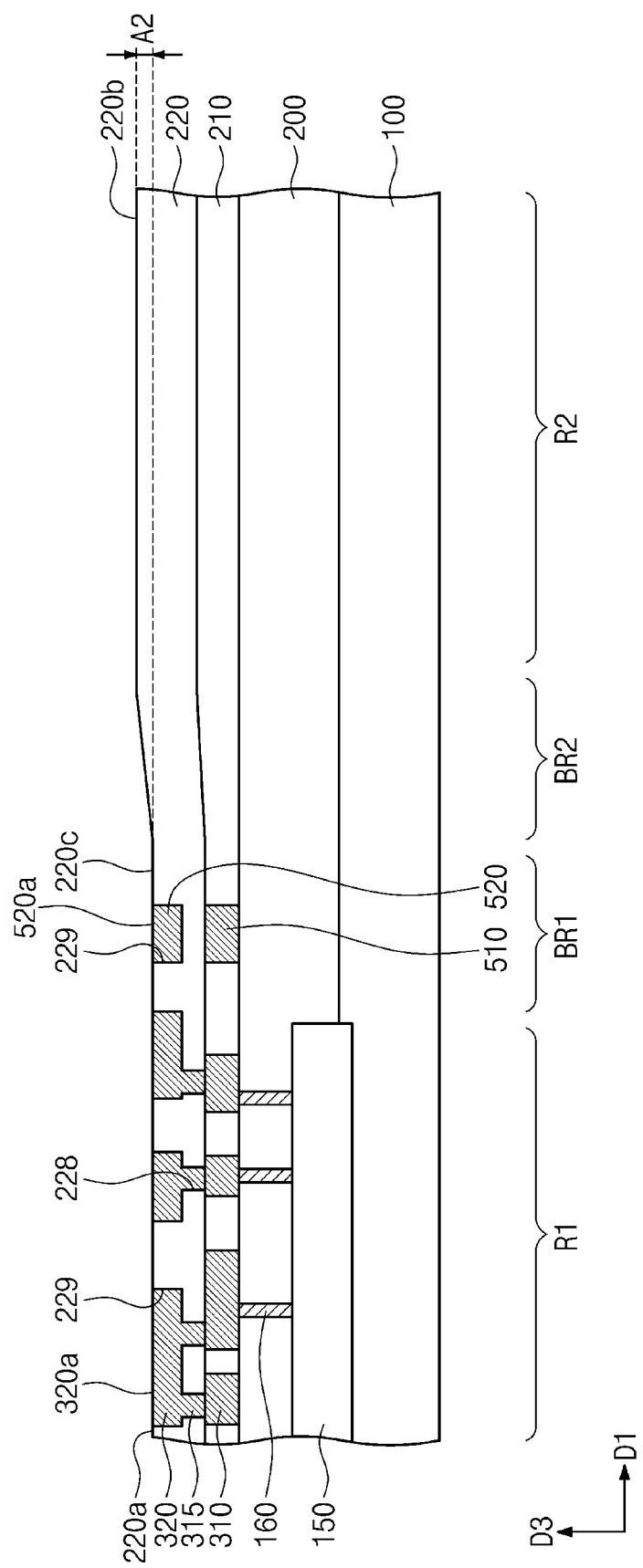

Referring to FIG. 2D, the second conductive layer 20 may be planarized to form a first conductive via 315, second conductive lines 320, and a second dummy pattern 520. The planarization of the second conductive layer 20 may continue until the second interlayer dielectric layer 220 is exposed. The first conductive via 315 may be formed in the first holes 228. The second conductive lines 320 and the second dummy pattern 520 may be locally provided in corresponding second trenches 229.

When the second conductive layer 20 is planarized, the second conductive layer 20 may be removed at a different rate from that of the second interlayer dielectric layer 220. For example, the second conductive layer 20 may be removed faster than the second interlayer dielectric layer 220. After the planarization process is terminated, the second interlayer dielectric layer 220 may have a top surface whose level becomes lowered as approaching the second trenches 229. The first top surface 220a of the second interlayer dielectric layer 220 may be located at a lower level than that of the second top surface 220b of the second interlayer dielectric layer 220.

In certain embodiments, the second dummy pattern 520 may be provided on the first buffer region BR1 of the substrate 100. When the second conductive layer 20 is planarized, although the second interlayer dielectric layer 220 on the second region R2 is removed at a different rate from that of the second interlayer dielectric layer 220 on the first region R1, the second interlayer dielectric layer 220 on the first buffer region BR1 may be removed at a rate the same as or similar to that of the second interlayer dielectric layer 220 on the first region R1. The second top surface 220b of the second interlayer dielectric layer 220 may be provided at a higher level than that of the first top surface 220a of the second interlayer dielectric layer 220. The third top surface 220c of the second interlayer dielectric layer 220 may be provided at a level the same as or similar to that of the first top surface 220a of the second interlayer dielectric layer 220. The third top surface 220c of the second interlayer dielectric layer 220 may alleviate a level difference A2 between the first and second top surfaces 220a and 220b of the second interlayer dielectric layer 220. A level difference between the first and third top surfaces 220a and 220c of the second interlayer dielectric layer 220 may be less than the level difference A2 between the first and second top surfaces 220a and 220b of the second interlayer dielectric layer 220. Therefore, the first top surface 220a of the second interlayer dielectric layer 220 may be substantially flat. The second conductive lines 320 may have top surfaces 320a coplanar with the first top surface 220a of the second interlayer dielectric layer 220. The top surface 320a of an outermost second conductive line 320 may be provided at substantially the same level as that of the top surfaces 320a of the second conductive lines 320 on the central area of the first region R1. As a result, a semiconductor device may increase in reliability.

The second dummy pattern 520 may have a top surface 520a coplanar with the third top surfaces 220c of the second interlayer dielectric layer 220. The top surface 520a of the second dummy pattern 520 may be provided at a level the same as or similar to that of the top surfaces 320a of the second conductive lines 320.

In certain embodiments, a ratio of total area of the top surface 520a of the second dummy pattern 520 to area of the third top surface 220c of the second interlayer dielectric layer 220 may be equal to or similar to a ratio of total area of the top surfaces 320a of the second conductive lines 320 to area of the first top surface 220a of the second interlayer dielectric layer 220. For this reason, the level difference between the first and third top surfaces 220a and 220c of the second interlayer dielectric layer 220 may become further reduced.

Figure 2E:
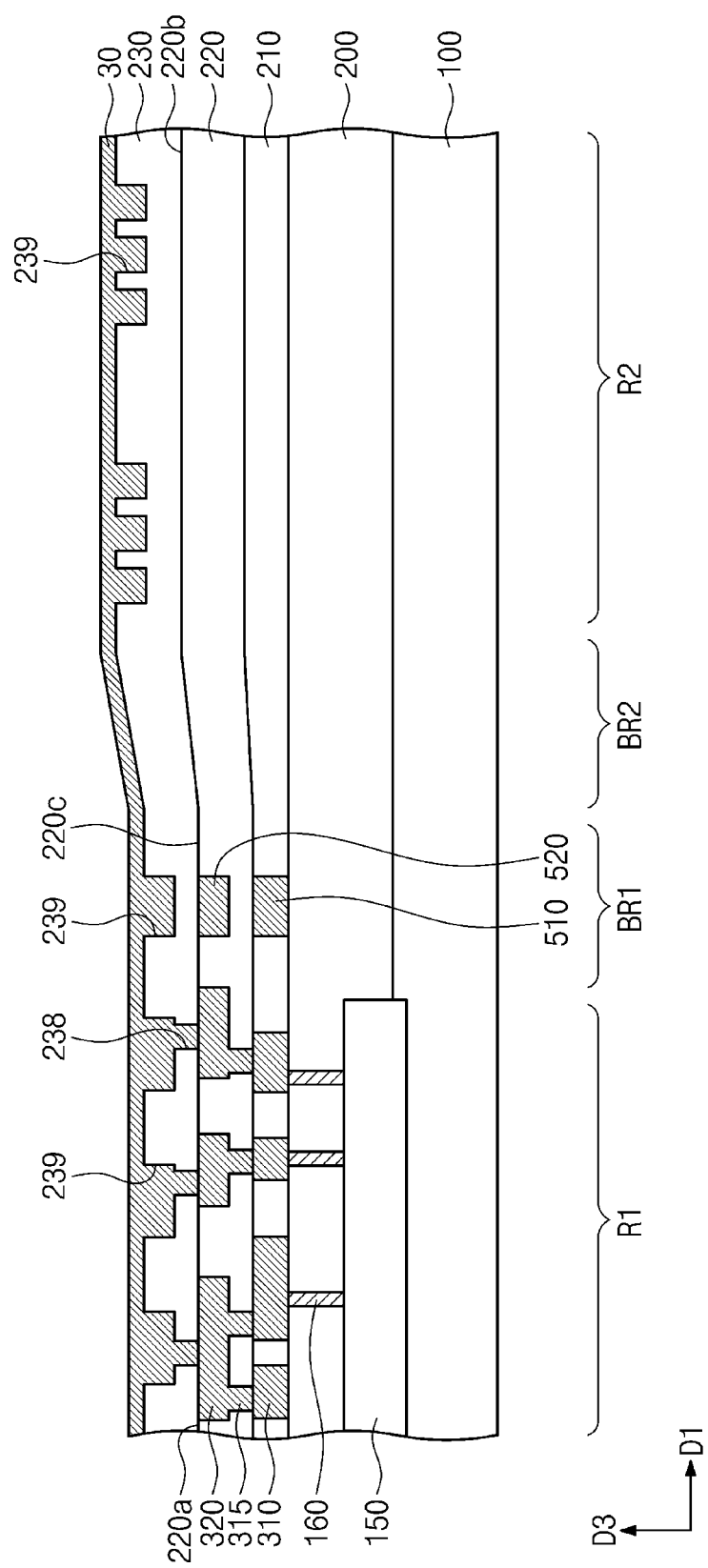

Referring to FIG. 2E, a third interlayer dielectric layer 230 may be formed on the first, second, and third top surfaces 220a, 220b, and 220c of the second interlayer dielectric layer 220, covering the second conductive lines 320 and the second dummy pattern 520. Third trenches 239 may be formed in an upper portion of the third interlayer dielectric layer 230. The third trenches 239 may be provided on the first region R1, the second region R2, and the first buffer region BR1 of the substrate 100. Second holes 238 may be formed on bottom surfaces of the third trenches 239 to penetrate a lower portion of the third interlayer dielectric layer 230. The second holes 238 may be provided on the first region R1, but not on the second region R2 and the buffer regions BR1 and BR2 of the substrate 100. A third conductive layer 30 may be formed on the third interlayer dielectric layer 230, filling the second holes 238 and the third trenches 239.

Figure 2F:
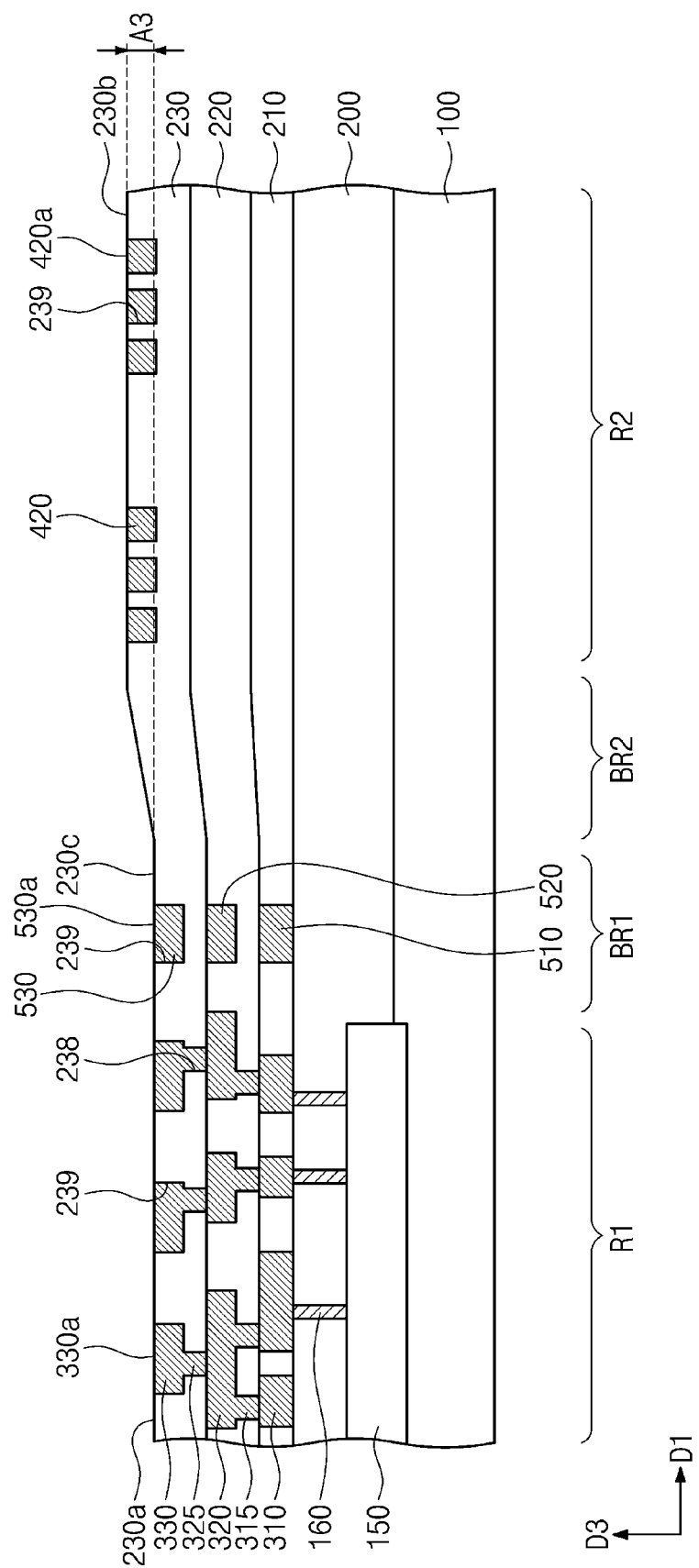

Referring to FIG. 2F, the third conductive layer 30 may be planarized to form a second conductive via 325, third conductive lines 330, a third dummy pattern 530, and a second conductor 420. The planarization of the third conductive layer 30 may be performed by chemical mechanical polishing or etch-back and may continue until the third interlayer dielectric layer 230 is exposed. The second via 325 may be formed in the second holes 238. The third conductive lines 330, the third dummy pattern 530, and the second conductor 420 may be locally provided in corresponding third trenches 239.

After the planarization process, the third interlayer dielectric layer 230 may have a first top surface 230a at a lower level than that of the second top surface 230b. In certain embodiments, the third dummy pattern 530 may be provided on the first buffer region BR1 of the substrate 100. When the third conductive layer 30 is planarized, the third interlayer dielectric layer 230 on the first region R1 may be removed at a rate the same as or similar to that of the third interlayer dielectric layer 230 on the first buffer region BR1. The third dummy pattern 530 may alleviate a level difference A3 between the first and second top surfaces 230a and 230b of the third interlayer dielectric layer 230. For example, the third interlayer dielectric layer 230 may have a third top surface 230c at a level lower than that of the second top surface 230b and the same as or similar to that of the first top surface 230a. A level difference between the first and third top surfaces 230a and 230c of the third interlayer dielectric layer 230 may be less than the level difference A3 between the first and second top surfaces 230a and 230b of the third interlayer dielectric layer 230. Therefore, the first top surface 230a of the third interlayer dielectric layer 230 may be substantially flat. The third conductive lines 330 may have top surfaces 330a coplanar with the first top surface 230a of the third interlayer dielectric layer 230. The top surface 330a of an outermost third conductive line 330 may be provided at substantially the same level as that of the top surfaces 330a of the third conductive lines 330 on the central area of the first region R1.

The second conductor 420 may have a top surface 420a coplanar with the second top surfaces 230b of the third interlayer dielectric layer 230. The top surface 420a of the second conductor 420 may be provided at a higher level than that of the top surfaces 330a of the third conductive lines 330.

The third dummy pattern 530 may have a top surface 530a coplanar with the third top surfaces 230c of the third interlayer dielectric layer 230. The top surface 530a of the third dummy pattern 530 may be provided at a level the same as or similar to that of the top surfaces 330a of the third conductive lines 330. The top surface 530a of the third dummy pattern 530 may be provided at a lower level than that of the top surface 420a of the second conductor 420. A level difference between the top surfaces 330a of the third conductive lines 330 and the top surface 530a of the third dummy pattern 530 may be less than a level difference between the top surface 530a of the third dummy pattern 530 and the top surface 420a of the second conductor 420. The level difference between the top surfaces 330a of the third conductive lines 330 and the top surface 530a of the third dummy pattern 530 may be substantially the same as the level difference between the third top surfaces 230c and the first top surface 230a of the third interlayer dielectric layer 230, and the level difference between the top surface 530a of the third dummy pattern 530 and the top surface 420a of the second conductor 420 may be substantially the same as the level difference between the third top surface 230c and the second top surface 230b of the third interlayer dielectric layer 230.

A ratio of total area of the top surface 530a of the third dummy pattern 530 to area of the third top surface 230c of the third interlayer dielectric layer 230 may be equal to or similar to a ratio of total area of the top surfaces 330a of the third conductive lines 330 to area of the first top surface 230a of the third interlayer dielectric layer 230. For this reason, the level difference between the first and third top surfaces 230a and 230c of the third interlayer dielectric layer 230 may become further reduced.

Figure 2G:
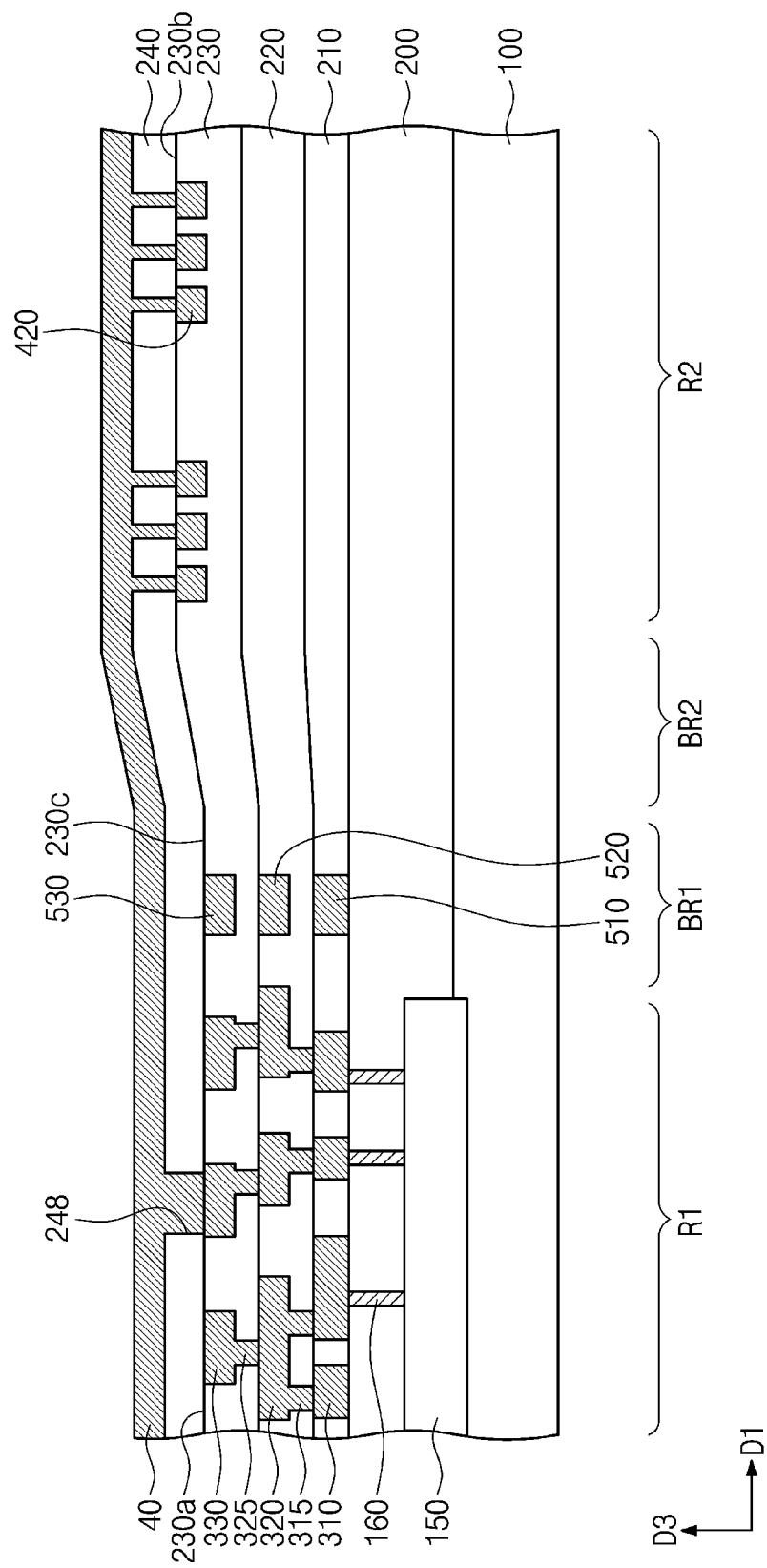

Referring to FIG. 2G, a fourth interlayer dielectric layer 240 may be formed on the first, second, and third top surfaces 230a, 230b, and 230c of the third interlayer dielectric layer 230, covering the third conductive lines 330, the third dummy pattern 530, and the second conductor 420. Third holes 248 may be formed in the fourth interlayer dielectric layer 240. The third holes 248 may overlap the first region R1 and the second region R2 of the substrate 100. A fourth conductive layer 40 may be formed on the top surface of the third interlayer dielectric layer 230, filling the third holes 248. The fourth conductive layer 40 may cover a top surface of the fourth interlayer dielectric layer 240.

Figure 2H:
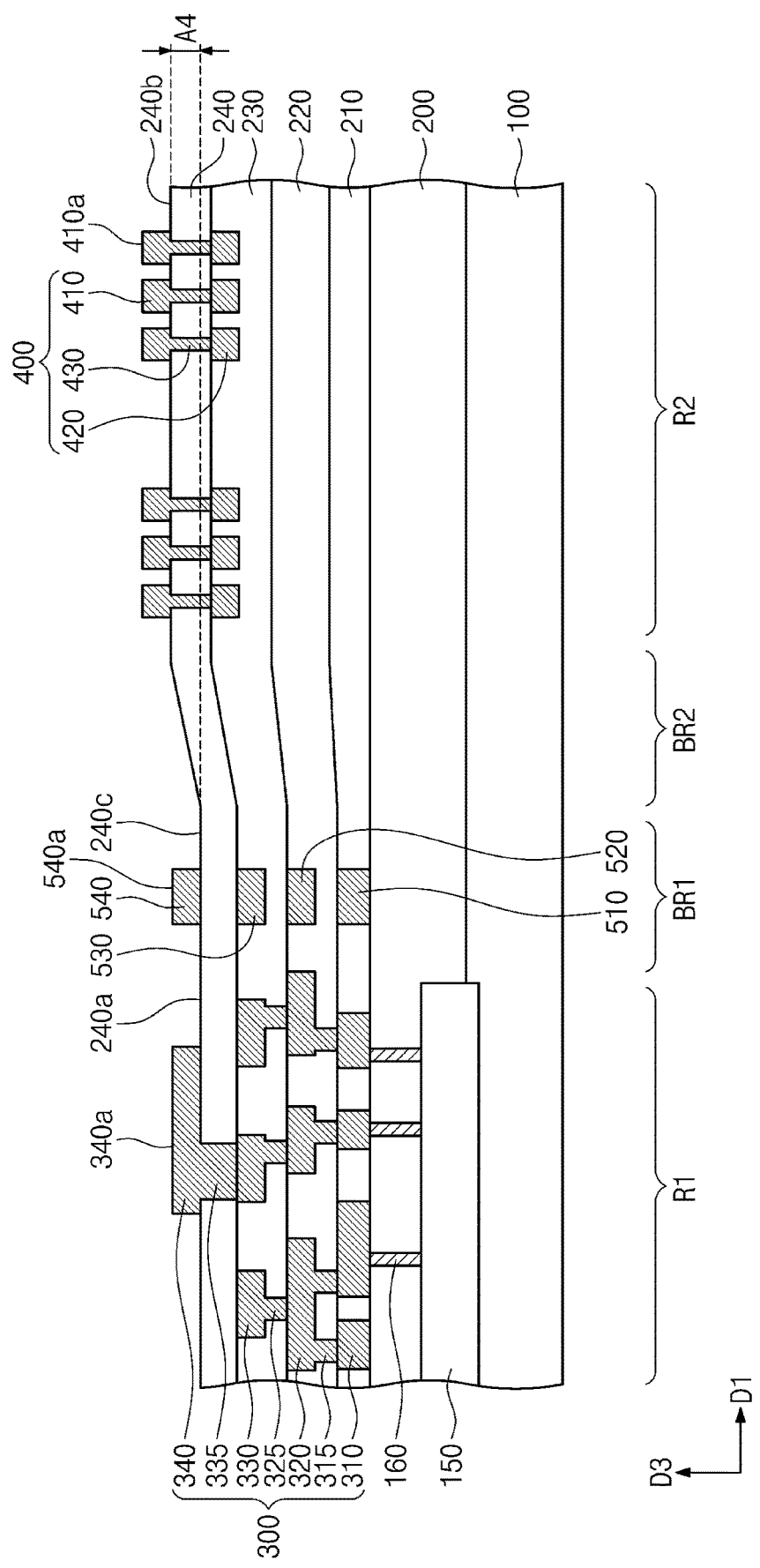

Referring to FIG. 2H, the fourth conductive layer 40 may be patterned to form a fourth conductive line 340, a fourth dummy pattern 540, and a first conductor 410. An etching process may be used to pattern the fourth conductive layer 40. The patterning of the fourth conductive layer 40 may separate the fourth conductive line 340, the fourth dummy pattern 540, and the first conductor 410 from each other. The fourth conductive lines 340 may be formed in corresponding third holes 248.

The fourth interlayer dielectric layer 240 may have a first top surface 240a and a second top surface 240b at provided at a higher level than that of the first top surface 240a. The fourth interlayer dielectric layer 240 may have a third top surface 240c at a level the same as or similar to that of the first top surface 240a of the fourth interlayer dielectric layer 240. A level difference between the first and third top surfaces 240a and 240c of the fourth interlayer dielectric layer 240 may be less than a level difference A4 between the first and second top surfaces 240a and 240b of the fourth interlayer dielectric layer 240. Therefore, the first top surface 240a of the fourth interlayer dielectric layer 240 may be substantially flat. Although not shown, the fourth conductive line 340 may be formed in plural. In this case, the fourth conductive lines 340 may have top surfaces 340a at substantially the same level. As a result, a semiconductor device may increase in reliability.

The first conductor 410 may have a top surface 410a at a higher level than that of the top surface 340a of the fourth conductive line 340. The fourth dummy pattern 540 may have a top surface 540a at a level the same as or similar to that of the top surfaces 340a of the fourth conductive lines 340. The top surface 540a of the fourth dummy pattern 540 may be provided at a lower level than that of the top surface 410a of the first conductor 410. A level difference between the top surface 340a of the fourth conductive line 340 and the top surface 540a of the fourth dummy pattern 540 may be less than a level difference between the top surface 540a of the fourth dummy pattern 540 and the top surface 410a of the first conductor 410. The level difference between the top surfaces 340a of the fourth conductive line 340 and the top surface 540a of the fourth dummy pattern 540 may be substantially the same as the level difference between the third top surface 240c and the first top surface 240a of the fourth interlayer dielectric layer 240, and the level difference between the top surface 540a of the fourth dummy pattern 540 and the top surface 410a of the first conductor 410 may be substantially the same as the level difference between the third top surface 240c and the second top surface 240b of the fourth interlayer dielectric layer 240.

Referring back to FIGS. 1A to 1D, a passivation layer 280 and a connection terminal 390 may be formed on the fourth interlayer dielectric layer 240, which may eventually fabricate a semiconductor device.

The first buffer region BR1 may have width W of about 15 μm to about 30 μm, as shown in FIG. 1C. For example, the width W of the first buffer region BR1 may be a horizontal interval spaced apart from an outermost one of the first to fourth conductive lines 310, 320, 330, and 340. FIG. 1C shows that the third conductive line 330 corresponds to the outermost one of the first to fourth conductive lines 310, 320, 330, and 340, but the present disclosure is not limited thereto. When the width W of the buffer region BR1 is less than about 15 μm, the third top surfaces 210c, 220c, 230c, and 240c of the interlayer dielectric layers 210, 220, 230, and 240 may be insufficient to alleviate the level differences between corresponding first top surfaces 210a, 220a, 230a, and 240a and corresponding second top surfaces 210b, 220b, 230b, and 240b. In certain embodiments, when the width W of the buffer region BR1 is equal to or greater than about 15 μm, the third top surfaces 210c, 220c, 230c, and 240c of the interlayer dielectric layers 210, 220, 230, and 240 may alleviate the level differences between corresponding first top surfaces 210a, 220a, 230a, and 240a and corresponding second top surfaces 210b, 220b, 230b, and 240b. Therefore, each of the first top surfaces 210a, 220a, 230a, and 240a of the interlayer dielectric layers 210, 220, 230, and 240 may be substantially flat.

In certain embodiments, the dummy patterns 510, 520, 530, and 540 may be variously changed in terms of the number, planar shapes, and arrangement. Differently from that shown in FIG. 1D, at least one of the first to fourth dummy patterns 510, 520, 530, and 540 may not be provided. The first to fourth dummy patterns 510, 520, 530, and 540 may be aligned in the third direction D3. For another example, one or more of the first to fourth dummy patterns 510, 520, 530, and 540 may not be aligned in the third direction D3. The dummy patterns 510, 520, 530, and 540 are illustrated in the form of planar rectangular shapes, but may have linear shapes extending one direction.

Figure 3:
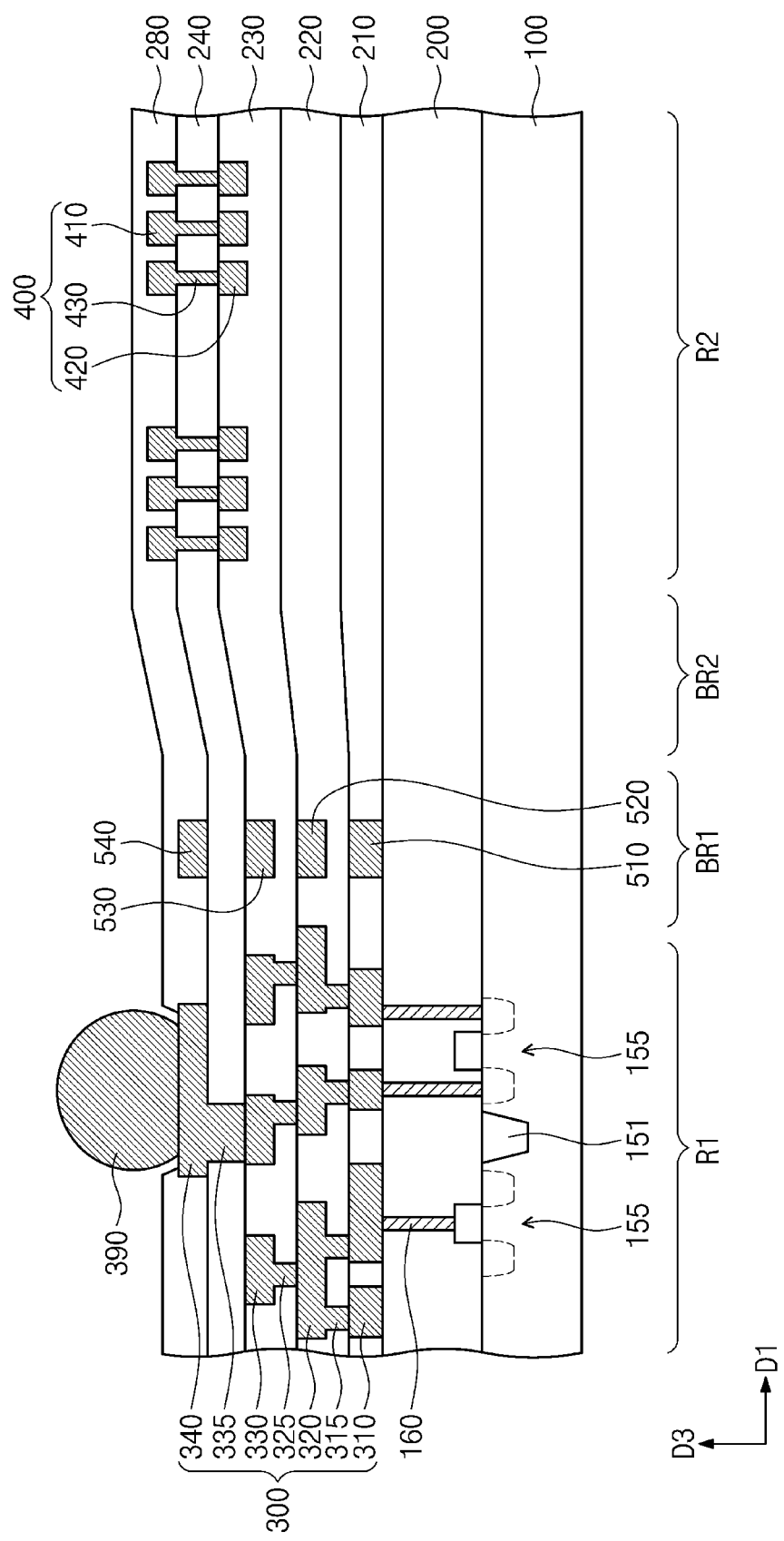
FIG. 3 illustrates a cross-sectional view showing a lower structure according to some example embodiments.

FIG. 3 illustrates a cross-sectional view taken along line I-II of FIG. 1A and along line I'-II' of FIG. 1B, showing a lower structure according to some example embodiments. A duplicate description will be omitted below.

Referring to FIG. 3, the lower structure 150 may include inner components and the inner components may include transistors 155. The transistors 155 may be provided on a top surface of the substrate 100. The transistors 155 may include logic transistors and/or memory transistors. The contact plugs 160 may penetrate the lower dielectric layer 200 and have connection with gate patterns and/or source/drain patterns.

A device isolation pattern 151 may further provided on the first region R1 of the substrate 100. The device isolation pattern 151 may be provided in the substrate 100 and may define active regions for the transistors 155. The device isolation pattern 151 may include a dielectric material. For example, the formation of the device isolation pattern 151 may include forming a trench on the top surface of the substrate 100 and filling the trench with a dielectric material.

Figure 4A:
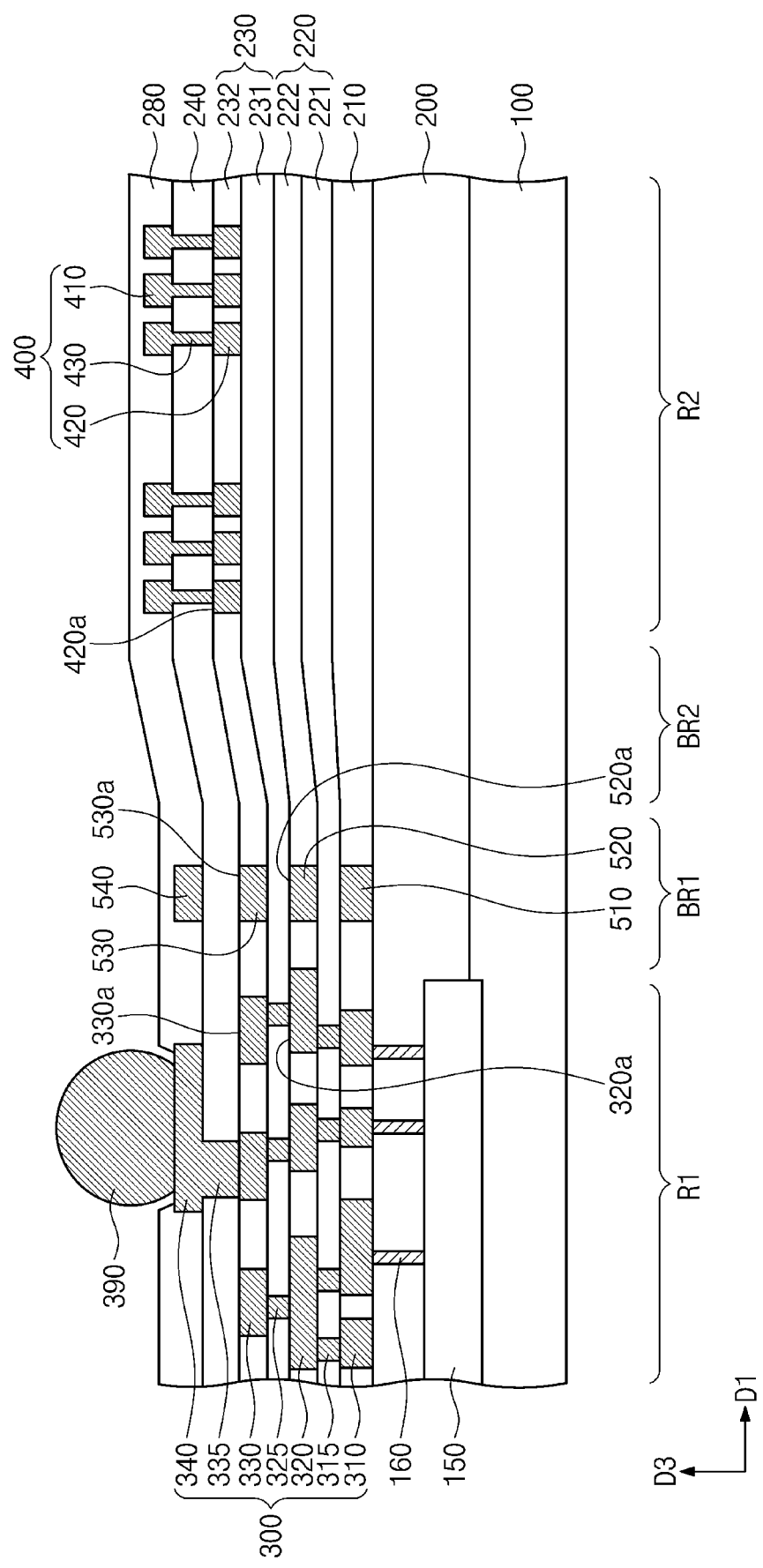
FIG. 4A illustrates a cross-sectional view showing a semiconductor device according to some example embodiments.

FIG. 4A illustrates a cross-sectional view taken along line I-II of FIG. 1A and along line I'-II' of FIG. 1B, showing a semiconductor device according to some example embodiments. A duplicate description will be omitted below.

Referring to FIGS. 1A, 1B, and 4A, a semiconductor device may include the substrate 100, the lower structure 150, the lower dielectric layer 200, the first to fourth interlayer dielectric layers 210, 220, 230, and 240, the conductive structure 300, the inductor 400, and the dummy patterns 510, 520, 530, and 540. A single damascene process may be employed to form the conductive structure 300, the dummy patterns 510, 520, 530, and 540, the second conductor 420, the via 430, and the first conductor 410.

The second interlayer dielectric layer 220 may include a second lower interlayer dielectric layer 221 and a second upper interlayer dielectric layer 222. The first conductive via 315 may be provided in the second lower interlayer dielectric layer 221. The second conductive lines 320 and the second dummy pattern 520 may be provided on the second lower interlayer dielectric layer 221 and in the second upper interlayer dielectric layer 222. The top surface 520a of the second dummy pattern 520 may be provided at a level the same as or similar to that of the top surfaces 320a of the second conductive lines 320. The second conductive lines 320 and the second dummy pattern 520 may be formed by separate processes from the formation of the second conductive via 325.

The third interlayer dielectric layer 230 may include a third lower interlayer dielectric layer 231 and a third upper interlayer dielectric layer 232. The third conductive via 335 may be provided in the third lower interlayer dielectric layer 231. The third conductive lines 330, the third dummy pattern 530, and the second conductor 420 may be provided on a top surface of the third lower interlayer dielectric layer 231 and in the third upper interlayer dielectric layer 232. The top surface 420a of the second conductor 420 may be provided at a different level from (e.g., at a higher level than) that of the top surfaces 330a of the third conductive lines 330. The top surface 530a of the third dummy pattern 530 may be provided at a level the same as or similar to that of the top surfaces 330a of the third conductive lines 330. The third conductive lines 330, the third dummy pattern 530, and the second conductor 420 may be formed by separate processes from the formation of the third conductive via 335.

The fourth conductive lines 340, the fourth dummy patterns 510, 520, 530, and 540, and the first conductor 410 may be formed by separate processes from the formation of the third conductive via 335.

A top surface of each of the interlayer dielectric layers 210, 220, 230, and 240 may include a first top surface, a second top surface, and a third top surface. The first, second, and third top surfaces of each of the interlayer dielectric layers 210, 220, 230, and 240 may be provided respectively on the first region R1, the second region R2, and the first buffer region BR1 of the substrate 100. The second top surface of each of the interlayer dielectric layers 210, 220, 230, and 240 may be provided at a different level from that of the first top surface. For example, the second top surface of each of the interlayer dielectric layers 210, 220, 230, and 240 may be provided at a higher level than that of the first top surface. The third top surface of each of the interlayer dielectric layers 210, 220, 230, and 240 may be provided at a level the same as or similar to that of the first top surface. A level difference between the third and first top surfaces of each of the interlayer dielectric layers 210, 220, 230, and 240 may be less than a level difference between the second and first top surfaces of a corresponding one of the interlayer dielectric layers 210, 220, 230, and 240. Therefore, the first top surfaces of the interlayer dielectric layers may be substantially flat.

Those discussed above may be identically applicable to explain the substrate 100, the lower structure 150, the first to fourth interlayer dielectric layers 210, 220, 230, and 240, the passivation layer 280, the conductive structure 300, the inductor 400, and the dummy patterns 510, 520, 530, and 540.

Figure 4B:
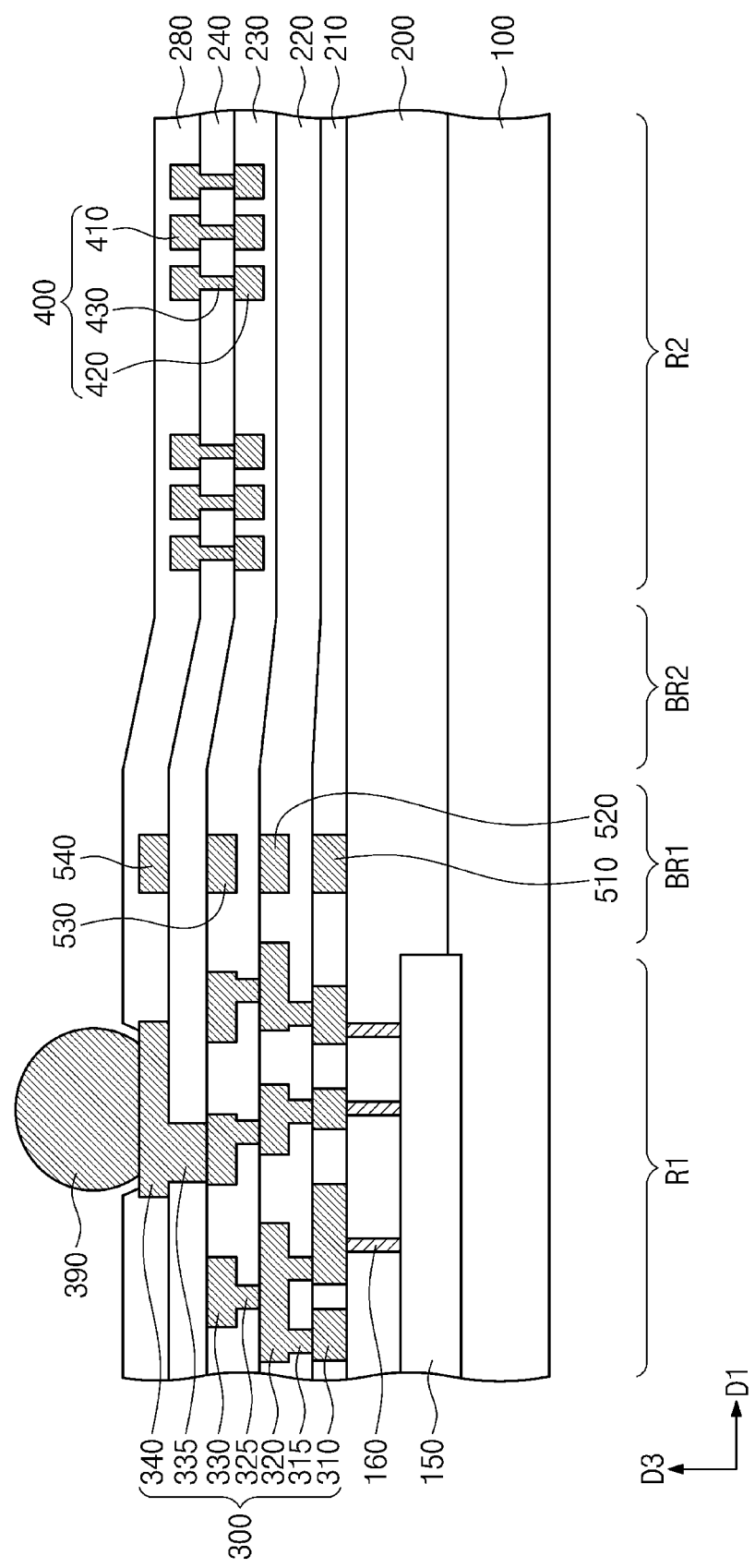
FIG. 4B illustrates a cross-sectional view showing a semiconductor device according to some example embodiments.

FIG. 4B illustrates a cross-sectional view taken along line I-II of FIG. 1A and along line I'-II' of FIG. 1B, showing a semiconductor device according to some example embodiments. A duplicate description will be omitted below.

Referring to FIGS. 1A, 1B, and 4B, a semiconductor device may include the substrate 100, the lower structure 150, the lower dielectric layer 200, the first to fourth interlayer dielectric layers 210, 220, 230, and 240, the passivation layer 280, the conductive structure 300, the inductor 400, and the dummy patterns 510, 520, 530, and 540.

The second top surface of each of the interlayer dielectric layers 210, 220, 230, and 240 may be provided at a lower level from that of the first top surface. The third top surface of each of the interlayer dielectric layers 210, 220, 230, and 240 may be provided at a level higher than that of the second top surface corresponding thereto and the same as or similar to that of the first top surface corresponding thereto. A level difference between the third and first top surfaces of each of the interlayer dielectric layers 210, 220, 230, and 240 may be less than a level difference between the second and first top surfaces of a corresponding one of the interlayer dielectric layers 210, 220, 230, and 240. Therefore, the first top surface of each of the interlayer dielectric layers may be substantially flat.

The top surface of the first dummy pattern 510 may be provided at a level the same as or similar to that of the top surfaces of the first conductive lines 310. The top surfaces of the first conductive lines 310 may be provided at substantially the same level.

The top surface of the second dummy pattern 520 may be provided at a level the same as or similar to that of the top surfaces of the second conductive lines 320. The top surfaces of the second conductive lines 320 may be provided at substantially the same level.

The top surface of the second conductor 420 may be provided at a lower level than that of the top surfaces of the third conductive lines 330. The top surfaces of the third conductive lines 330 may be provided at a level the same as or similar to that of the top surface of the third dummy pattern 530. A level difference between the top surfaces of the third conductive lines 330 and the top surface of the third dummy pattern 530 may be less than a level difference between the top surface of the third dummy pattern 530 and the top surface of the second conductor 420.

The top surface of the first conductor 410 may be provided at a lower level than that of the top surfaces of the fourth conductive lines 340. The top surface of the fourth dummy pattern 540 may be provided at a level the same as or similar to that of the top surface of the fourth conductive line 340. A level difference between the top surface of the fourth conductive line 340 and the top surface of the fourth dummy pattern 540 may be less than a level difference between the top surface of the fourth dummy pattern 540 and the top surface of the first conductor 410.

According to the present disclosure, no conductive components may be provided between a lowermost surface of an inductor and a top surface of a lower dielectric layer. A minimum horizontal distance between conductive structures and dummy patterns may be less than that between the dummy patterns and the inductor. As a result, it may be possible to prevent the occurrence of parasitic capacitance.

Conductive lines, inductors, and dummy patterns may be provided respectively on first, second, and third top surfaces of an interlayer dielectric layer. The dummy patterns may alleviate level differences between the first surfaces and the second surfaces of the interlayer dielectric layer. Therefore, the first top surfaces of the interlayer dielectric layers may be substantially flat. The conductive lines may have their top surfaces at the same level. As a result, semiconductor devices may increase in reliability.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The detailed description of the present disclosure may be used in various other combinations, modifications, and environments without departing from the subject matter of the present disclosure.

What is claimed is:

1. A semiconductor device comprising:
    a substrate having a first region, a second region, and a buffer region between the first region and the second region;
    a lower interlayer dielectric layer on the substrate;
    a conductive line on a top surface of the lower interlayer dielectric layer on the first region of the substrate;
    a dummy pattern on the top surface of the lower interlayer dielectric layer on the buffer region of the substrate; and
    an inductor on the second region of the substrate, wherein:
        the inductor includes a conductor on the top surface of the lower interlayer dielectric layer and the conductor has a first inner surface and a second inner surface facing each other, wherein:
    the dummy pattern is not provided between the first inner surface and the second inner surface of the conductor,
    the dummy pattern is not provided on the second region of the substrate,
    no conductive component is disposed between the dummy pattern and the inductor,
    a top surface of the conductive line is provided at a different level from that of a top surface of the conductor, and
    when viewed in plan, a first minimum distance between the dummy pattern and the conductive lines is less than a second minimum distance between the dummy pattern and the inductor.

2. The semiconductor device of claim 1, wherein a level difference between a top surface of the dummy pattern and the top surface of the conductive line is less than a level difference between the top surface of the conductor and the top surface of the dummy pattern.

3. The semiconductor device of claim 1, wherein:
    the buffer region includes:
        a first buffer region between the first region and the second region; and
        a second buffer region between the first buffer region and the second region, and
    the dummy pattern is provided on the first buffer region of the substrate and is not provided on the second buffer region of the substrate.

4. The semiconductor device of claim 1, wherein the top surface of the lower interlayer dielectric layer on the first region of the substrate is provided at a different level from that of the top surface of the lower interlayer dielectric layer on the second region of the substrate.

5. The semiconductor device of claim 1, further comprising:
   an upper interlayer dielectric layer on the lower interlayer dielectric layer, wherein:
   the upper interlayer dielectric layer includes:
      a first top surface on the first region of the substrate; and
      a second top surface on the second region of the substrate and connected to the first top surface, and
   the first top surface is provided at a different level from that of the second top surface.

6. The semiconductor device of claim 5, wherein:
   the top surface of the conductive line is coplanar with the first top surface of the upper interlayer dielectric layer, and
   the top surface of the conductor is coplanar with the second top surface of the upper interlayer dielectric layer.

7. The semiconductor device of claim 1, further comprising:
   a lower conductive line on the lower interlayer dielectric layer on the first region of the substrate; and
   a lower dummy pattern in the lower interlayer dielectric layer on the buffer region of the substrate, wherein
   the inductor is not provided in the lower interlayer dielectric layer.

8. The semiconductor device of claim 7, wherein the dummy pattern is not provided on and in the lower interlayer dielectric layer on the second region of the substrate.

9. The semiconductor device of claim 1, wherein:
   the buffer region has a width of about 15 μm to about 30 μm, and
   the first minimum distance is less than the width of the buffer region.

* * * * *